(12) United States Patent
Takahashi et al.

(10) Patent No.: US 10,714,706 B2
(45) Date of Patent: Jul. 14, 2020

(54) DISPLAY DEVICE

(71) Applicant: Sharp Kabushiki Kaisha, Sakai, Osaka (JP)

(72) Inventors: Jumpei Takahashi, Sakai (JP); Tohru Sonoda, Sakai (JP); Takashi Ochi, Sakai (JP); Takeshi Hirase, Sakai (JP); Hisao Ochi, Sakai (JP); Tohru Senoo, Sakai (JP); Akihiro Matsui, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/472,918

(22) PCT Filed: Sep. 25, 2017

(86) PCT No.: PCT/JP2017/034555
§ 371 (c)(1),
(2) Date: Jun. 24, 2019

(87) PCT Pub. No.: WO2019/058555
PCT Pub. Date: Mar. 28, 2019

(65) Prior Publication Data
US 2019/0319217 A1  Oct. 17, 2019

(51) Int. Cl.
*H01L 51/52* (2006.01)
*H01L 27/32* (2006.01)
(52) U.S. Cl.
CPC ...... *H01L 51/5253* (2013.01); *H01L 27/3244* (2013.01); *H01L 27/3211* (2013.01)

(58) Field of Classification Search
CPC ............. H01L 51/5253; H01L 27/3244; H01L 27/3211
See application file for complete search history.

(56) References Cited

U.S. PATENT DOCUMENTS

| 9,991,326 | B2* | 6/2018 | Iijima | H01L 51/5253 |
| 2003/0071569 | A1* | 4/2003 | Chung | H01L 51/5246 |
| | | | | 313/512 |
| 2007/0046178 | A1* | 3/2007 | Imai | H01L 27/1222 |
| | | | | 313/504 |

(Continued)

FOREIGN PATENT DOCUMENTS

| JP | 2007-073353 A | 3/2007 |
| JP | 2014-511019 A | 5/2014 |

(Continued)

OTHER PUBLICATIONS

Official Communication issued in International Patent Application No. PCT/JP2017/034556, dated Dec. 26, 2017.

*Primary Examiner* — Nathan W Ha
(74) *Attorney, Agent, or Firm* — Keating & Bennett, LLP

(57) ABSTRACT

An organic EL display device including: a base substrate; an organic EL element formed on the base substrate, and including a plurality of organic EL layers arranged in a matrix shape; and a sealing film formed on the organic EL element, wherein a plurality of subpixels are defined in association with the plurality of organic EL layers, and a plurality of grooves are formed in the sealing film through the interstices among the plurality of subpixels, and a foreign-matter contact portion configured to be in contact with a foreign matter existing on the organic EL element is formed in the sealing film.

20 Claims, 13 Drawing Sheets

(56) References Cited

U.S. PATENT DOCUMENTS

| | | |
|---|---|---|
| 2011/0084290 A1* | 4/2011 | Nakamura ............. H05B 33/02 |
| | | 257/89 |
| 2013/0171902 A1* | 7/2013 | Wang .................. H01L 51/5253 |
| | | 445/24 |
| 2014/0124767 A1 | 5/2014 | Maindron et al. |
| 2014/0264300 A1 | 9/2014 | Kamiya |
| 2015/0102313 A1* | 4/2015 | Heo .................... H01L 27/3248 |
| | | 257/40 |
| 2015/0144977 A1* | 5/2015 | Odaka et al. ........... H01L 33/44 |
| | | 257/98 |
| 2016/0043151 A1 | 2/2016 | Kato |
| 2016/0043340 A1 | 2/2016 | Ohara |
| 2017/0077195 A1 | 3/2017 | Seo et al. |
| 2017/0250380 A1 | 8/2017 | Kato |
| 2017/0256596 A1 | 9/2017 | Hamada et al. |

FOREIGN PATENT DOCUMENTS

| | | |
|---|---|---|
| JP | 2014-179278 A | 9/2014 |
| JP | 2016-039070 A | 3/2016 |
| JP | 2016-039078 A | 3/2016 |
| JP | 2017-151313 A | 8/2017 |
| JP | 2017-157406 A | 9/2017 |
| KR | 10-2017-0050538 A | 5/2017 |

\* cited by examiner

FIG. 5A
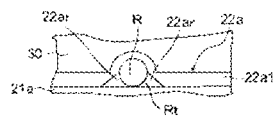
FIG. 5B
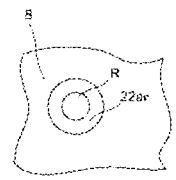
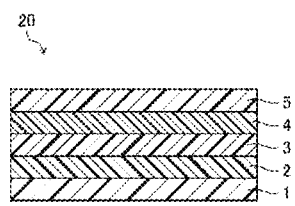
FIG. 6
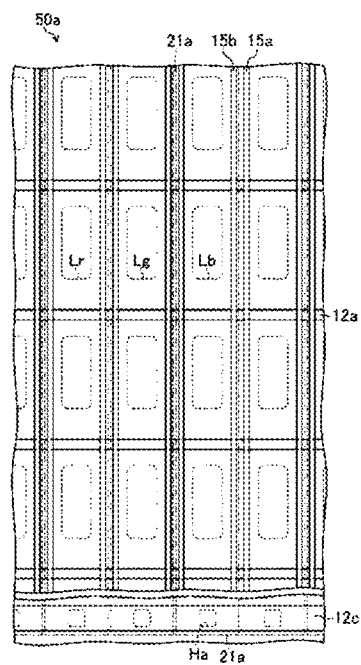
FIG. 7

FIG. 11A
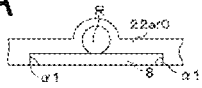
FIG. 11B
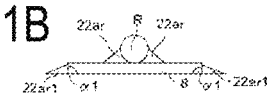
FIG. 11C
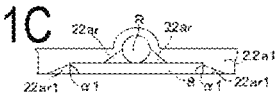
FIG. 11D
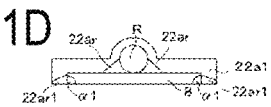
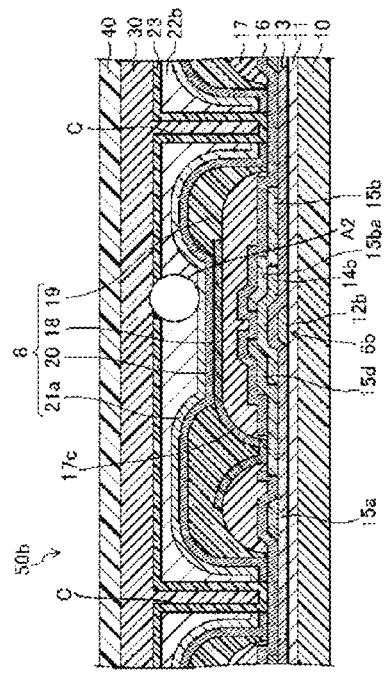
FIG. 12
FIG. 13A
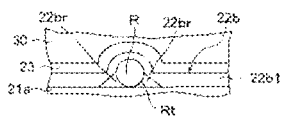
FIG. 13B
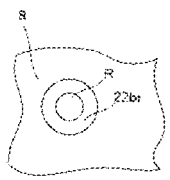

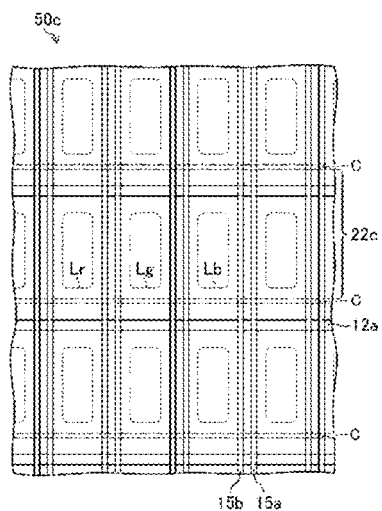
FIG. 14
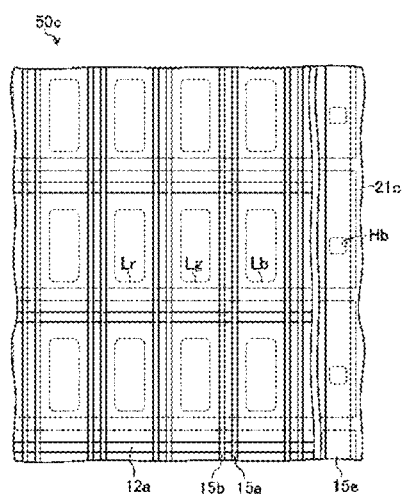
FIG. 15
FIG. 16A
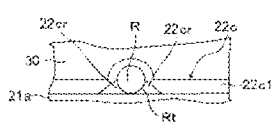
FIG. 16B
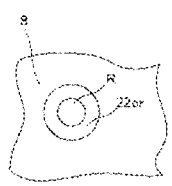

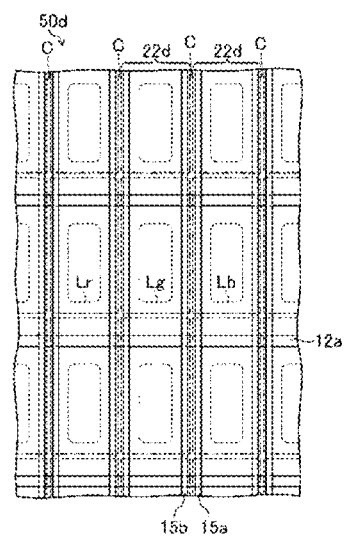
FIG. 17
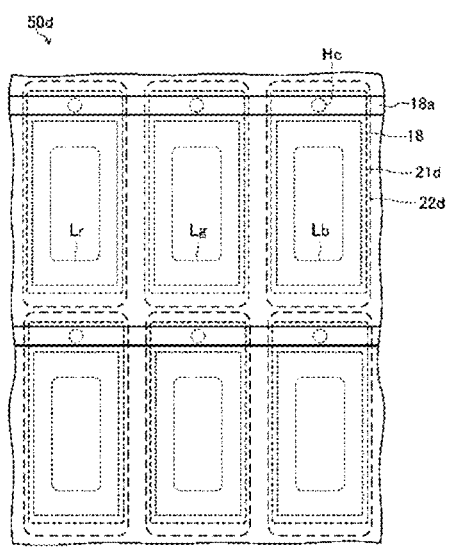
FIG. 18
FIG. 19A
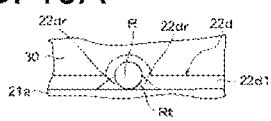
FIG. 19B

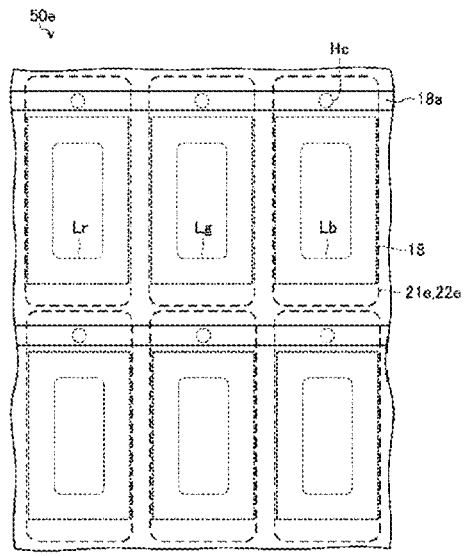
FIG. 20
FIG. 21A
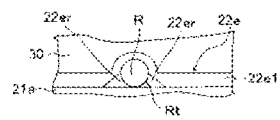
FIG. 21B
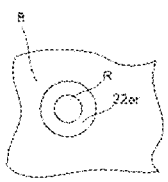

FIG. 24A
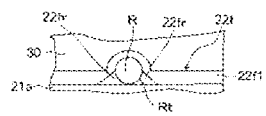
FIG. 24B
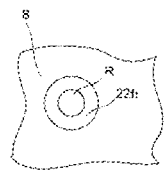
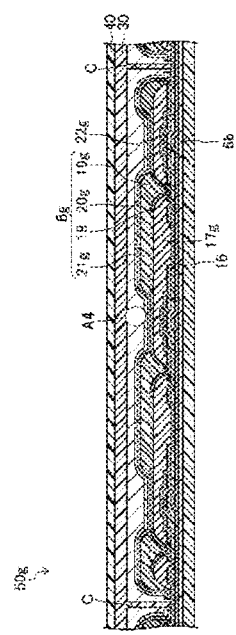
FIG. 25
FIG. 26A
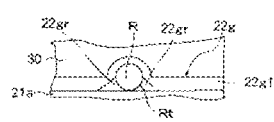
FIG. 26B
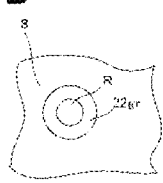

DISPLAY DEVICE

TECHNICAL FIELD

The disclosure relates to a display device and a method for manufacturing the same.

BACKGROUND ART

In recent years, organic electroluminescence (EL) display devices, which use organic EL elements and are of the self-luminous type, have attracted attention as a display device that can replace the liquid crystal display device. A general organic EL display device is provided with a sealing film covering the organic EL element to inhibit degradation of the organic EL element due to penetration of, for example, moisture and oxygen.

For example, PTL 1 discloses a method of manufacturing an organic EL element through a process of patterning the sealing film, which is achieved by performing a dry etching process using a metal mask to remove some part of the sealing film.

CITATION LIST

Patent Literature

PTL 1: JP 2007-73353 A

SUMMARY

Technical Problem

The sealing film includes, as a constituent, at least an inorganic film, which is fragile in nature. Hence, a stress, if applied to the inorganic film, tends to cause cracks in the inorganic film easily. Accordingly, a bending stress that is generated by bending an organic EL display device including a sealing film may result in cracks in the sealing film. The cracks impair the sealing ability of the sealing film, resulting in a less reliable organic EL display device.

The disclosure has been made in view of the problem mentioned above, and provides an organic EL display device that can be bent without causing cracks in the sealing film even in a case where a foreign matter exists on the organic EL element.

Solution to Problem

To achieve the above-described objective, a display device according to the disclosure includes: a base substrate; a display element formed on the base substrate and including a plurality of display layers arranged in a matrix shape; and a sealing film formed on the display element. In the display device, a plurality of subpixels are defined in association with the plurality of display layers, and in the sealing film: a plurality of grooves are formed through the interstices among the plurality of subpixels; and a foreign-matter contact portion configured to be in contact with a foreign matter existing on the display element is formed.

In addition, a display-device manufacturing method according to a different aspect of the disclosure is a method of manufacturing the display device including the steps of: forming a foreign-matter contact layer configured to cover the display element and a foreign matter existing on the display element; and forming the foreign-matter contact portion by ashing the foreign-matter contact layer.

In addition, a display-device manufacturing method according to a different aspect of the disclosure is a method of manufacturing the display device including the steps of: forming an inorganic film configured to cover the display element and a foreign matter existing on the display element; forming a foreign-matter contact layer configured to cover the inorganic film; and forming the foreign-matter contact portion by ashing the foreign-matter contact layer.

In addition, a display-device manufacturing method according to a different aspect of the disclosure is a method of manufacturing the display device, wherein the inorganic barrier film is formed by forming an aluminum oxide film by an atomic layer deposition method and the aluminum oxide covers the plurality of portions of the sealing film, which are separated.

Advantageous Effects of Disclosure

The sealing film provided on the display element includes the grooves to be formed between every two adjacent ones of the plurality of subpixels. Hence, the display device can be bent without causing cracks in the sealing film. In addition, the sealing film includes the foreign-matter contact portion configured to be in contact with a foreign matter that exists on the display element. Hence, a flawless sealing film can be formed even in a case where a foreign matter exists on the display element. In addition, the generation of the above-mentioned cracks can be prevented.

BRIEF DESCRIPTION OF DRAWINGS

FIG. 5A is an enlarged view of a portion A1 illustrated in FIG. 4 of a case where a foreign matter exists in the portion A1. FIG. 5B is a plan view illustrating the foreign matter and the portion contacting the foreign matter (foreign-matter contact portion) illustrated in FIG. 5A.

FIG. 6 is a cross-sectional view illustrating an organic EL layer included in the organic EL display device according to the first embodiment of the disclosure.

FIG. 7 is a plan view illustrating a second-electrode arrangement structure in the organic EL display device according to the first embodiment of the disclosure.

FIGS. 11A to 11D are diagrams describing a series of main steps of manufacturing main portions of an organic EL display device according to Comparative Example 1.

FIG. 12 is a cross-sectional view illustrating an organic EL display device according to a second embodiment of the disclosure, and is a diagram corresponding to FIG. 4.

FIG. 13A is an enlarged view of a portion A2 illustrated in FIG. 12 of a case where a foreign matter exists in the portion A2. FIG. 13B is a plan view illustrating the foreign matter and the foreign-matter contact portion illustrated in FIG. 13A.

FIG. 14 is a plan view illustrating a sealing-film arrangement structure in an organic EL display device according to a third embodiment of the disclosure.

FIG. 15 is a plan view illustrating a second-electrode arrangement structure in the organic EL display device according to the third embodiment of the disclosure.

FIG. 16A is an enlarged schematic view illustrating a foreign matter existing in the organic EL display device according to the third embodiment of the disclosure and a portion around the foreign matter. FIG. 16B is a plan view illustrating the foreign matter and the foreign-matter contact portion illustrated in FIG. 16A.

FIG. 17 is a plan view illustrating a sealing-film arrangement structure in an organic EL display device according to a fourth embodiment of the disclosure.

FIG. 18 is a plan view illustrating a second-electrode connection structure in the organic EL display device according to the fourth embodiment of the disclosure.

FIG. 19A is an enlarged schematic view illustrating a foreign matter existing in the organic EL display device according to the fourth embodiment of the disclosure and a portion around the foreign matter. FIG. 19B is a plan view illustrating the foreign matter and the foreign-matter contact portion illustrated in FIG. 19A.

FIG. 20 is a plan view illustrating a second-electrode connection structure in an organic EL display device according to a modified example of the fourth embodiment of the disclosure.

FIG. 21A is an enlarged schematic view illustrating a foreign matter existing in the organic EL display device according to the Modified Example of the fourth embodiment of the disclosure and a portion around the foreign matter. FIG. 21B is a plan view illustrating the foreign matter and the foreign-matter contact portion illustrated in FIG. 21A.

FIG. 24A is an enlarged view of a portion A3 illustrated in FIG. 23 of a case where a foreign matter exists in the portion A3. FIG. 24B is a plan view illustrating the foreign matter and the foreign-matter contact portion illustrated in FIG. 24A.

FIG. 25 is a cross-sectional view illustrating an organic EL display device according to a modified example of the fifth embodiment of the disclosure, and is a diagram corresponding to FIG. 4.

FIG. 26A is an enlarged view of a portion A4 illustrated in FIG. 25 of a case where a foreign matter exists in the portion A4. FIG. 26B is a plan view illustrating the foreign matter and the foreign-matter contact portion illustrated in FIG. 26A.

DESCRIPTION OF EMBODIMENTS

Embodiments of the disclosure will be described below in detail with reference to the drawings. The disclosure is not limited to the embodiments described below. In addition, the following description will be based on a case where the disclosure is applied to an organic EL display device. In addition, in each of the drawings, the dimensions of constituent elements are not precisely illustrated as the actual dimensions of the constituent elements and the dimensional proportions of each of the constituent elements.

First Embodiment

Figure 1:
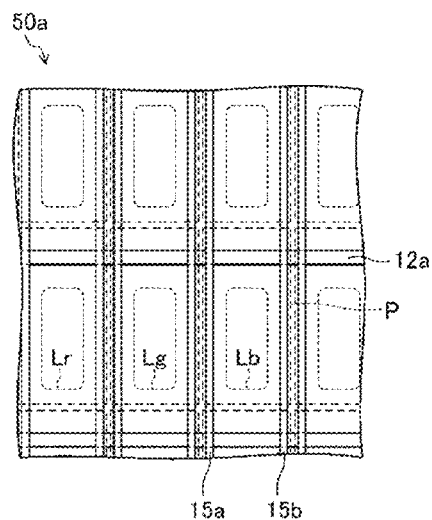
FIG. 1 is a plan view illustrating a pixel structure of an organic EL display device according to a first embodiment of the disclosure.
Figure 2:
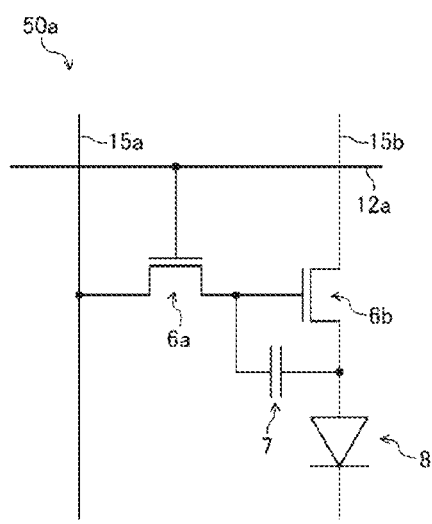
FIG. 2 is an equivalent circuit schematic of each of subpixels of the organic EL display device according to the first embodiment of the disclosure.
Figure 3:
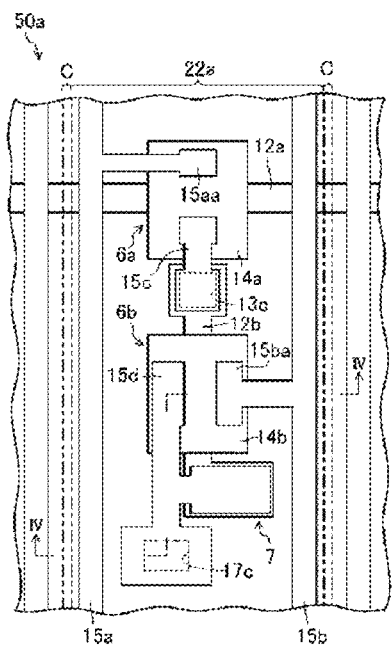
FIG. 3 is a plan view illustrating an interior structure of each subpixel of the organic EL display device according to the first embodiment of the disclosure.
Figure 4:
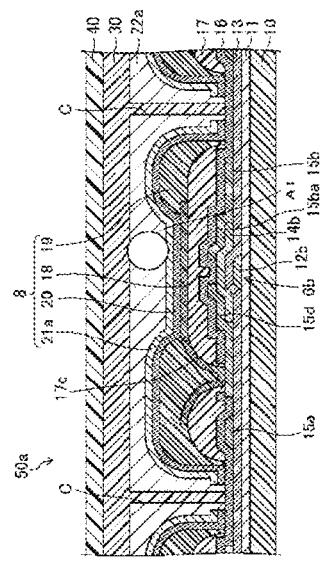
FIG. 4 is a cross-sectional view of the organic EL display device taken along the line IV-IV in FIG. 3.
Figure 8:
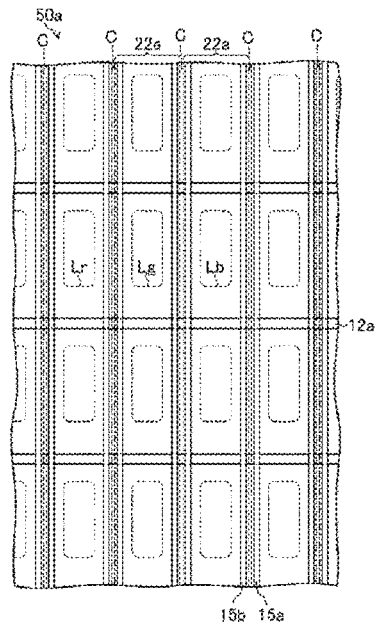
FIG. 8 is a plan view illustrating a sealing-film arrangement structure in the organic EL display device according to the first embodiment of the disclosure.

FIG. 1 to FIG. 8 illustrate the first embodiment of an organic EL display device according to the disclosure. FIG. 1 is a plan view illustrating a pixel structure of an organic EL display device 50a according to the present embodiment. FIG. 2 is an equivalent circuit schematic of each of subpixels P of the organic EL display device 50a. FIG. 3 is a plan view illustrating an interior structure of each subpixel P of the organic EL display device 50a. FIG. 4 is a cross-sectional view of the organic EL display device 50a taken along the line IV-IV in FIG. 3. FIG. 5A is an enlarged view of a portion A1 illustrated in FIG. 4 of a case where a foreign matter exists in the portion A1. FIG. 5B is a plan view illustrating the foreign matter and the portion contacting the foreign matter (foreign-matter contact portion) illustrated in FIG. 5A. FIG. 6 is a cross-sectional view illustrating an organic EL layer 20 included in the organic EL display device 50a. FIG. 7 is a plan view illustrating an arrangement structure of second electrodes 21a in the organic EL display device 50a. FIG. 8 is a plan view illustrating an arrangement structure of sealing film 22a in the organic EL display device 50a.

The organic EL display device 50a includes a display region that has a rectangular shape in a plan view. In the display region, a plurality of subpixels P (see FIG. 1) are arranged in a matrix shape. As illustrated in FIG. 1, the display region of the organic EL display device 50a includes: subpixels P each of which includes a red-color-light emitting region Lr configured to display a red-color grayscale; subpixel P each of which includes a green-color-light emitting region Lg configured to display a green-color grayscale; and subpixel P each of which includes a blue-color-light emitting region Lb configured to display a blue-color grayscale. The subpixels P of these three different colors are disposed side by side with one another. Each single pixel included in the display region of the organic EL display device 50a includes three mutually adjacent subpixels P: one including a red-color-light emitting region Lr; another including a green-color-light emitting region Lg; and the other including a blue-color-light emitting region Lb.

As illustrated in FIG. 4, the organic EL display device 50a includes: a base substrate 10; a plurality of organic EL elements 8; a plurality of sealing films 22a; an adhesive layer 30; and a function layer 40. Each of the organic EL elements 8 is formed as a display element over the base substrate 10, and in between are structures from a moisture-proof film 11 to interlayer insulating films 17 (which will be described later). Each of the plurality of sealing films 22a is formed on the corresponding one of the organic EL elements 8. The function layer 40 is formed over the plurality of sealing films 22a with the adhesive layer 30 provided in between.

As will be described later, each of the organic EL elements 8 included in the organic EL display device 50a has end portions each of which has a certain taper angle with respect to the base substrate 10. The certain taper angle is not larger than a predetermined angle (the details of this taper angle will be described later).

The base substrate 10 is a plastic substrate made from a polyimide resin, for example.

The moisture-proof film 11 is formed on the base substrate 10, and is made of a silicon oxide film, a silicon nitride film, and a silicon oxynitride film, for example. As illustrated in FIG. 2 and FIG. 3, a plurality of gate lines 12a are formed on the moisture-proof film 11. The gate lines 12a extend in parallel to one another, and each of the gate lines 12a extends in the horizontal direction in each of the above-mentioned drawings. In addition, as illustrated in FIG. 3 and FIG. 4, in each of the subpixel P, a gate electrode 12b of a drive thin film transistor (drive TFT) 6b (which will be described later) is formed on the moisture-proof film 11. The gate electrode 12b has an island shape extending in the vertical direction in FIG. 3. In addition, as illustrated in FIG. 4, a gate insulating film 13 is formed on the moisture-proof film 11 and covers the gate lines 12a and the gate electrodes 12b. The gate lines 12a and the gate electrodes 12b are formed of metal films made, for example, from aluminum, titanium, tungsten, tantalum, copper, or alloys thereof. In addition, the gate insulating film 13 is formed, for example, of a silicon oxide film, a silicon nitride film, or a silicon oxynitride film.

As illustrated in FIG. 3 and FIG. 4, a first semiconductor layer 14a and a second semiconductor layer 14b are formed on the gate insulating film 13. In each of the subpixels P, the first semiconductor layer 14a and the second semiconductor layer 14b are laid over the corresponding gate line 12a and the corresponding gate electrode 12b, respectively. In addition, as illustrated in FIG. 3 and FIG. 4, a plurality of data lines 15a are formed on the gate insulating film 13. The data lines 15a extend in parallel to one another in the vertical direction in FIG. 3. In addition, as illustrated in FIG. 3 and FIG. 4, a plurality of power source lines 15b are formed on the gate insulating film 13. The power source lines 15b are adjacent to the corresponding data lines 15a and extend in parallel to one another. Note that the first semiconductor layer 14a and the second semiconductor layer 14b are made, for example, from amorphous silicon, low-temperature polysilicon, or In—Ga—Zn—O based oxide semiconductors.

As illustrated in FIG. 3, in each of the subpixels P, a source electrode 15aa is formed on the gate insulating film 13 and the first semiconductor layer 14a. The source electrode 15aa extends, from the corresponding data line 15a, in the horizontal direction in FIG. 3. In addition, as illustrated in FIG. 3, in each of the subpixels P, an island-shaped drain electrode 15c is formed on the gate insulating film 13 and the first semiconductor layer 14a. The drain electrode 15c extends in the vertical direction in FIG. 3. As illustrated in FIG. 3, part of the gate line 12a, the gate insulating film 13, the first semiconductor layer 14a, the source electrode 15aa, and drain electrode 15c together form a switching TFT 6a.

As illustrated in FIG. 3 and FIG. 4, in each of the subpixels P, an island-shaped drain electrode 15d is formed on the gate insulating film 13 and the second semiconductor layer 14b. The drain electrode 15d extends in the vertical direction in FIG. 3. In addition, as illustrated in FIG. 3 and FIG. 4, a source electrode 15ba is formed on the gate insulating film 13 and the second semiconductor layer 14b. The source electrode 15ba extends, from the corresponding power source line 15b, in the horizontal direction in FIG. 3. As illustrated in FIG. 3 and FIG. 4, the gate electrode 12b, the gate insulating film 13, the second semiconductor layer 14b, the source electrode 15ba, and the drain electrode 15d together form the drive TFT 6b. Note that the data lines 15a, the source electrode 15aa, the power source lines 15b, the source electrode 15ba, the drain electrode 15c, and drain electrode 15d are formed of metal films made, for example, from aluminum, titanium, tungsten, tantalum, copper, or alloys thereof. In addition, a passivation film 16 is formed on the gate insulating film 13, and the plurality of interlayer insulating films 17 are formed on the gate insulating film 13 as illustrated in FIG. 4. The passivation film 16 and the interlayer insulating films 17 cover the drive TFT 6b except its connection portion of the drain electrode 15d, and the switching TFT 6a. Note that passivation film 16 is formed, for example, of a silicon oxide film, a silicon nitride film, or a silicon oxynitride film. In addition, the plurality of interlayer insulating films 17 are formed, for example, extending in parallel to one another in the vertical direction in FIG. 3. The interlayer insulating film 17 includes, for example, a transparent organic resin material, such as an acrylic resin. Note that as illustrated in FIG. 2 and FIG. 3, the drain electrode 15c of the switching TFT 6a is connected to the gate electrode 12b of the drive TFT 6b via a contact hole 13c formed in the gate insulating film 13. In addition, as illustrated in FIG. 2 and FIG. 3, the gate electrode 12b of the drive TFT 6b, the drain electrode 15d, and the gate insulating film 13 located in between together form a capacitor 7. In addition, as illustrated in FIG. 2 to FIG. 4, the drain electrode 15d of the drive TFT 6b is connected to the organic EL element 8 via a contact hole 17c formed in the interlayer insulating film 17.

As illustrated in FIG. 4, the organic EL element 8 includes: a plurality of first electrodes 18, a plurality of edge covers 19, a plurality of organic EL layers 20, and a plurality of second electrodes 21a. All of these components are formed in this order one upon another on and over the interlayer insulating films 17.

The plurality of first electrodes 18 are formed as anode electrodes in individual subpixels P, and are arranged in a matrix shape on the interlayer insulating films 17. In addition, as illustrated in FIG. 4, in each of the subpixels P, the first electrode 18 is connected to the drain electrode 15d of the drive TFT 6*b* via the contact hole 17*c* formed in the interlayer insulating film 17. The first electrode 18 functions to inject holes into the organic EL layer 20. It is more preferable that the first electrodes 18 include a material having a large work function to improve the efficiency of hole injection into the organic EL layer 20. Examples of materials that may be included in the first electrode 18 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (Yb). Further examples of materials that may be included in the first electrode 18 include alloys, examples of which include magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the first electrode 18 include electrically conductive oxides, examples of which include tin oxide (SnO), zinc oxide (ZnO), indium tin oxide (ITO), and indium zinc oxide (IZO). In addition, each of the first electrodes 18 may include a stack of two or more layers each of which is made of the above-mentioned materials, such as ITO/Ag, IZO/Ag, and IZO/Al. Note that some of the conductive oxides and the like materials have large work functions, and that examples of such materials include indium tin oxide (ITO) and indium zinc oxide (IZO).

The plurality of edge covers 19 are formed, for example, extending in parallel to one another in the vertical direction in FIG. 3. In addition, as illustrated in FIG. 4, the edge covers 19 are formed in a ladder shape and thus cover the edge portions of the first electrodes 18 of all the subpixels P that are arranged in a single vertical line in FIG. 3. Note that each of the edge covers 19 may be, for example, an inorganic film or an organic film. Examples of materials that may be included in the inorganic film include silicon oxide ($SiO_2$), silicon nitride (SiNx (x is a positive number)) such as trisilicon tetranitride ($Si_3N_4$), and silicon oxynitride (SiNO). Examples of materials that may be included in the organic film include (photosensitive) polyimide resins, (photosensitive) acrylic resins, (photosensitive) polysiloxane resins, and novolak resins.

The plurality of organic EL layers 20 are included respectively in the individual subpixels P. The organic EL layers 20 are arranged in a matrix shape on the first electrodes 18 and edge covers 19. In addition, in each of the subpixels P, the organic EL layer 20 covers the first electrode 18 exposed from the edge covers 19. As illustrated in FIG. 6, each of the organic EL layers 20 includes a hole injecting layer 1, a hole transport layer 2, a light-emitting layer 3, an electron transport layer 4, and an electron injecting layer 5, which are arranged in the order stated over the first electrode 18. In addition, each of the organic EL layers 20 is an example of the display layer mentioned in the scope of claims.

The hole injecting layer 1 is also referred to as an anode buffer layer, and functions to reduce the energy level difference between the first electrode 18 and the organic EL layer 20, to improve the efficiency of hole injection into the organic EL layer 20 from the first electrode 18. Examples of materials that may be included in the hole injecting layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 18 to the organic EL layer 20. Examples of materials that may be included in the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where the holes and the electrons recombine, when a voltage is applied via the first electrode 18 and the second electrode 21*a*, holes and electrons are injected from the first electrode 18 and the second electrode 21*a*, respectively. The light-emitting layer 3 includes a material having a high light emitting efficiency. Examples of materials that may be included in the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of the electrons to the light-emitting layer 3 efficiently. Examples of materials that may be included in the electron transport layer 4 include organic compounds, example of which include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injecting layer 5 functions to reduce the energy level difference between the second electrode 21*a* and the organic EL layer 20, to improve the efficiency of electron injection into the organic EL layer 20 from the second electrode 21*a*. Because of this function, the driving voltage for the organic EL layer 20 can be reduced. The electron injecting layer 5 is also referred to as a cathode buffer layer. Examples of materials that may be included in the electron injecting layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$), and strontium oxide (SrO).

As illustrated in FIG. 7, the plurality of second electrodes 21*a* are formed extending in parallel to one another in the vertical direction in FIG. 7. In addition, as illustrated in FIG. 7, each of the second electrodes 21*a* has an elongated rectangular shape in a plan view and thus is laid over the organic EL layers 20 of all the subpixels P that are arranged in a single vertical line in FIG. 7. To put it differently, each of the second electrodes 21*a* is electrically connected to the corresponding subpixels P arranged in a vertical single line in FIG. 7 and configured to display the grayscale of the same color. When one of the second electrodes 21a is connected to a particular subpixel P, that one of the two second electrodes 21a is connected to none of the two subpixels P that are adjacent to the particular subpixel in the horizontal direction and that are configured to display the grayscale of different colors from the color of that particular subpixel P. In addition, as illustrated in FIG. 7, in the non-display region, the second electrodes 21a are connected to a common wiring line 12c via contact holes Ha formed in a layered film of the gate insulating film 13 and the passivation film 16. The common wiring line 12c is made of the same material as the material of the gate lines 12a and is formed in the same layer where the gate lines 12a are formed. The second electrode 21a functions to inject electrons into the organic EL layer 20. It is more preferable that the second electrode 21a includes a material having a small work function to improve the efficiency of electron injection into the organic EL layer 20. Examples of materials that may be included in the second electrode 21a include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (Yb). Further examples of materials that may be included in the second electrode 21a include alloys, examples of which include magnesium (Mg)-copper (Cu), magnesium (Mg)-silver (Ag), sodium (Na)-potassium (K), astatine (At)-astatine oxide (AtO$_2$), lithium (Li)-aluminum (Al), lithium (Li)-calcium (Ca)-aluminum (Al), and lithium fluoride (LiF)-calcium (Ca)-aluminum (Al). Further examples of materials that may be included in the second electrode 21a include electrically conductive oxides, examples of which include tin oxide (SnO), zinc oxide (ZnO), indium tin oxide (ITO), and indium zinc oxide (IZO). The second electrode 21a may include a stack of two or more layers of any of the above-mentioned materials, such as ITO/Ag. Examples of materials having a small work function include magnesium (Mg), lithium (Li), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 8, the plurality of sealing films 22a are formed extending in parallel to one another in the vertical direction in FIG. 8. In addition, as illustrated in FIG. 4 and FIG. 8, the sealing films 22a are formed on the corresponding second electrodes 21a, respectively. Each of the sealing films 22a has an elongated rectangular shape in a plan view and thus covers the end faces of the organic EL layers 20 of all the subpixels P that are arranged in a single vertical line in FIG. 8. In addition, as illustrated in FIG. 4 and FIG. 8, the grooves C are formed between every two adjacent ones of the plurality of sealing films 22a. Each of the grooves C extends in the vertical direction in FIG. 8 between the corresponding two subpixels P (see also FIG. 3). In addition, the sealing films 22a have a function to protect the organic EL layers 20 from moisture and oxygen.

In addition, for example, as illustrated in FIG. 5A and FIG. 5B, in a case where a foreign matter R exists on the second electrode 21a (on the organic EL element 8), the sealing film 22a includes a first sealing layer 22a1 that is layered on the second electrode 21a, and also includes a foreign-matter contact portion 22ar that is configured to contact the foreign matter R. To put it differently, suppose a case where while an organic EL display device 50a is being manufactured, at least one foreign matter R exists in at least any one position on the organic EL element 8 in the organic EL display device 50a as illustrated in the enclosure A1 in FIG. 4. In this case, one foreign-matter contact portion 22ar is formed in the sealing film 22a for each place where a foreign matter R exists. In addition, the foreign-matter contact portion 22ar has a smaller taper angle than 90° with respect to the base substrate 10 as will be described in detail later.

In addition, as illustrated in FIG. 5A, the foreign-matter contact portion 22ar is configured to surround the foreign matter R and to contact at least a surface portion Rt of the foreign matter R located on the organic EL element 8 side of the foreign matter R. In addition, in the sealing film 22a, the foreign-matter contact portion 22ar and the first sealing layer 22a1 wrap up the foreign matter R. Note that the first sealing layer 22a1 is formed, for example, of a single layer film or a layered film of inorganic materials such as a silicon oxide film, a silicon nitride film, and a silicon oxynitride film. Note that the present embodiment is based on a case where the first sealing layer 22a1 is formed of an inorganic film, but that the first sealing layer 22a1 may be a layered film including not only one or more of the above-mentioned inorganic films and an organic film that is layered on the inorganic film. The organic film may be formed from acrylate, polyurea, parylene, polyimide, polyamide, or the like. In addition, the foreign-matter contact portion 22ar includes one of the above-mentioned organic films. In addition, the foreign matter R is, for example, a glass piece or dust, such as a by-product of organic vapor deposition, that exists in a chamber (not illustrated) used in the manufacturing of various portions of the organic EL display device 50a.

The adhesive layer 30 is, for example, a UV-hardening-type adhesive, a thermosetting adhesive, an epoxy adhesive, an acrylic adhesive, or a polyolefin adhesive.

The function layer 40 is formed, for example, of a hard-coat film, a retardation plate, or a polarizing plate.

In a case where the organic EL display device 50a with the configuration described above displays images, in each of the subpixels P, a gate signal is inputted into the switching TFT 6a via the gate line 12a and thus the switching TFT 6a is turned ON. Then, in each of the subpixels P in the organic EL display device 50a, a predetermined voltage corresponding to a source signal is applied, via the data line 15a, to the gate electrode 12b of the drive TFT 6b. In addition, in each of the subpixels P of the organic EL display device 50a, the magnitude of the current from the power source line 15b is defined based on the voltage of the gate electrode 12b of the drive TFT 6b, and the current is supplied to the light-emitting layer 3 of the organic EL element 8. In this way, the light-emitting layer 3 emits light. Note that in the organic EL display device 50a, even in a case where the switching TFT 6a is turned OFF, the voltage of the gate electrode 12b of the drive TFT 6b is maintained by the capacitor 7. Hence, the emission of light by the light-emitting layer 3 continues until the gate signal for the next frame is inputted.

The organic EL display device 50a of the present embodiment can be manufactured in the following manner, for example.

Firstly, for example, on a surface of the base substrate 10 formed on a glass substrate, a moisture-proof layer 11; TFT arrays including the switching TFTs 6a, the drive TFTs 6b, and the like; the passivation film 16; and the interlayer insulating films 17 are formed by a well-known method.

Then, on the interlayer insulating films 17, the first electrodes 18, the edge covers 19, the organic EL layers 20, and the second electrodes 21a are formed sequentially by a well-known method, and thus, the organic EL elements 8 are formed.

In addition, after an inorganic film (which is to be the sealing film 22a) and a photoresist are formed on the second electrodes 21a by a well-known method, the inorganic film exposed from the photoresist is etched by use of buffered hydrofluoric acid, and thus the sealing films 22a are formed.

Figure 9:
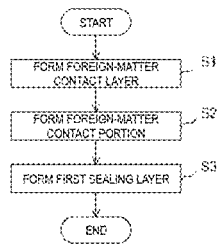
FIG. 9 is a flowchart describing steps of manufacturing main portions of the organic EL display device according to the first embodiment of the disclosure.

With reference to FIG. 9 and FIGS. 10A to 10E, a description will be given below about a specific method of forming the sealing films 22a of a case where a foreign matter R exists on the organic EL element 8. FIG. 9 is a flowchart describing steps of manufacturing main portions of the organic EL display device 50a according to the first embodiment of the disclosure. FIGS. 10A to 10E are diagrams describing a series of main steps of manufacturing the main portions of the organic EL display device 50a according to the first embodiment of the disclosure. Note that the following description is based on a case where the foreign-matter contact portions 22ar are formed by use of an organic film whereas the first sealing layers 22a1 are formed by use of an inorganic film.

Figure 10A:
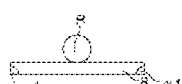
FIGS. 10A to 10E are diagrams describing a series of main steps of manufacturing the main portions of the organic EL display device according to the first embodiment of the disclosure.
Figure 10B:
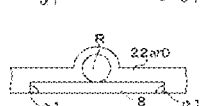

As illustrated in FIG. 9, the foreign-matter contact layer made of an organic film is formed to cover the organic EL elements 8 by a well-known method (Step S1). Note that as illustrated in FIG. 10A, in a case where a foreign matter R exists on the organic EL element 8, the foreign-matter contact layer 22ar0 is formed on both the foreign matter R and the organic EL element 8 as illustrated in FIG. 10B. Specifically, for example, a liquid organic material for the organic film is processed by a vapor deposition method to form the foreign-matter contact layer 22ar0 on both the foreign matter R and the organic EL element 8. Then, the foreign-matter contact layer 22ar0 is subjected, for example, to a UV irradiation process, and thus the foreign-matter contact layer 22ar0 is hardened on both the foreign matter R and the organic EL element 8.

In addition, as described earlier, in the organic EL element 8, with respect to the base substrate 10 (FIG. 4), the taper angle (denoted by "$\alpha 1$" in FIGS. 10A to 10E) of each end portion of the organic EL element 8 is set to an angle that is equal to or smaller than a predetermined angle (e.g., 30°). To put it differently, in the organic EL element 8, the organic EL layer 20 and the second electrode 21a are formed with end faces of the organic EL layer 20 and the second electrode 21a having angles with respect to the base substrate 10 that are equal to or smaller than the predetermined angle in FIG. 4, for example. Hence, in the present embodiment, the organic EL element 8 is prevented from being degraded by moisture (details of which will be described later).

Figure 10C:
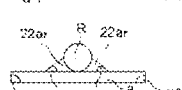

Then, as illustrated in Step S2 of FIG. 9, by performing a known ashing process on the foreign-matter contact layer 22ar0, the foreign-matter contact portion 22ar is formed on the organic EL element 8. To put it differently, as a portion of the foreign-matter contact layer 22ar0 has not been removed due to the existence of the foreign matter R, that portion is formed as the foreign-matter contact portion 22ar by performing the ashing process as illustrated in FIG. 10C. In addition, the foreign-matter contact portion 22ar is formed on the organic EL element 8 with the taper angle (denoted by "$\beta 1$" in FIGS. 10A to 10E) of the foreign-matter contact portion 22ar with respect to the base substrate 10 being smaller than 90°. In addition, in a case where no foreign matter R exists on the organic EL element 8, the foreign-matter contact layer 22ar0 is entirely removed by the ashing process, and thus no foreign-matter contact portion 22ar is formed in the sealing film 22a.

Figure 10D:
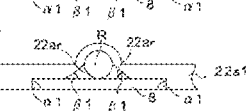
Figure 10E:
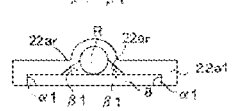

Then, a process of forming the first sealing layer 22a1 is performed as illustrated in Step S3 of FIG. 9. This formation process is performed by a well-known CVD method using, for example, an open mask or an FMM mask. Thus, as illustrated in FIG. 10D, the first sealing layer 22a1 is formed to cover the organic EL element 8, the foreign matter R, and the foreign-matter contact portion 22ar. Then, by performing a well-known etching process, the sealing films 22a for individual subpixels P are formed as illustrated in FIG. 10E.

Lastly, the function layer 40 is affixed to the sealing film 22a via the adhesive layer 30, and then the base substrate 10 is removed from the glass substrate by laser-light irradiation (e.g., see FIG. 4).

Comparative Example 1 where the taper angle $\alpha 1$ is larger than the predetermined angle has some problems, which are described specifically below with reference to FIGS. 11A to 11D. FIGS. 11A to 11D are diagrams describing a series of main steps of manufacturing main portions of an organic EL display device according to Comparative Example 1. Note that the following description is based on a case where the organic EL display device of Comparative Example 1 has a 90-degree taper angle $\alpha 1$ of each end portion of the organic EL element 8 with respect to the base substrate 10.

In the organic EL display device of Comparative Example 1, finishing the process in Step S1 leaves the foreign-matter contact layer 22ar0 formed on the organic EL element 8 as illustrated in FIG. 11A. Then, the ashing in Step S2 leaves unremoved, as remaining portions 22ar1, part of the organic film of the foreign-matter contact layer 22ar0 located in the end portions of the organic EL element 8 as illustrated in FIG. 11B. These remaining portions 22ar1 are the result of the taper angle $\alpha 1$ that is larger than the predetermined angle (e.g., 30°).

Then, finishing the process in Step S3, as illustrated in FIG. 11C, the first sealing layer 22a1 is formed on both the foreign-matter contact portion 22ar and the remaining portions 22ar1. Then, in a case where the sealing films are formed for individual subpixels P by a well-known etching process, the remaining portions 22ar1 may not be etched but exposed as illustrated in FIG. 11D. In a case where the remaining portions 22ar1 are exposed as described above, the remaining portions 22ar1 may absorb moisture through the adhesive layer 30, and the like. As a consequence, in Comparative Example 1, the moisture having been absorbed in remaining portions 22r1 may permeate the organic EL element 8 through the remaining portions 22ar1. The moisture may degrade the organic EL element 8.

In contrast, in the organic EL display device 50a of the present embodiment, each end portion of the organic EL element 8 has a taper angle $\alpha 1$ that is equal to or smaller than the predetermined angle. Hence, finishing the ashing process leaves no remaining portions 22ar1 in the end portions of the organic EL element 8, and thus the foreign-matter contact layer 22ar0 other than the foreign-matter contact portion 22ar can be removed by the ashing process. As a consequence, in the present embodiment, even in the case where a foreign matter R exists, consequences that are different from the consequences in Comparative Example 1 are produced. Specifically, the moisture is prevented from permeating the organic EL element 8 and the degradation of organic EL element 8 is prevented from being caused by the permeation of moisture. To put it differently, in the present embodiment, each end portion of the organic EL element 8 is formed to have the taper angle $\alpha 1$ that leaves no remaining portions 22ar1 in the end portions of the organic EL element 8 after the ashing process on the foreign-matter contact layer 22ar0.

The organic EL display device 50a of the present embodiment described above can have the following effects.

(1) In the sealing film 22a, the grooves C are formed between every two adjacent ones of the plurality of subpixels P. Hence, the organic EL display device 50a has a smaller rigidity at portions between two adjacent ones of the plurality of subpixels P where the grooves C are formed. Hence, in a case where the organic EL display device 50a is bent around a bent axis that is parallel to the data lines 15a, in the organic EL display device 50a, a larger bending strain is generated in the outer portions of the subpixel P where the grooves C are formed whereas a smaller bending strain is generated in the inner portions of the subpixel P where no grooves C are formed. To put it differently, the bending strain to be generated at the time of bending is determined to a certain amount c depending on the distance from the neutral surface (a surface that is neither stretched nor shrunk) and the bending radius. In a case where both a lower-rigidity portion and a higher-rigidity portion exist the same distance away from the neutral surface, the lower-rigidity portion has a larger strain (ε1) and the higher-rigidity portion has a smaller strain (ε2). Note that ε=ε1+ε2, meaning that the total strain ε is constant. Hence, in a case where there is no lower-rigidity portion (ε1=0), ε2=ε. In a case where there is a lower-rigidity portion, the strain in the higher-rigidity portion (ε2) is obtained by subtracting the strain in the lower-rigidity portion from the total strain ε (i.e., ε2=ε−ε1), meaning that a smaller value ε2 is obtained. Hence, as the sealing film 22a has a smaller strain, the generation of cracks in the sealing film 22a can be suppressed. Accordingly, when the organic EL display device 50a is bent, the generation of cracks in the sealing film 22a is suppressed. In addition, as the generation of cracks in the sealing film 22a can be suppressed, the sealing film 22a has an improved sealing performance, and thus the organic EL display device 50a becomes more reliable.

(2) In addition, the foreign-matter contact portion 22ar that contacts the foreign matter R existing on the organic EL element 8 is formed in the sealing film 22a. Hence, even in the case where a foreign matter R exists on the organic EL element 8, the generation of cracks in the sealing film 22a can be suppressed, and thus the organic EL display device 50a becomes more reliable. In addition, the foreign-matter contact portion 22ar is formed to contact at least the surface portion Rt of the foreign matter R located on the organic EL element 8 side of the foreign matter R. Hence, the foreign-matter contact portion 22ar can suppress the stress from the foreign matter R to the organic EL element 8 side when the organic EL display device 50a is bent. In addition, the existence of the foreign-matter contact portion 22ar in the sealing film 22a allows the first sealing layer 22a1 and thus the sealing film 22a to be formed without causing faults. Hence, even in the case where a foreign matter R exists, the sealing performance for the organic EL element 8 can be prevented from being impaired, and thus the organic EL element 8 can be more reliable.

Second Embodiment

FIG. 12 to FIG. 13B illustrate the second embodiment of an organic EL display device according to the disclosure. FIG. 12 is a cross-sectional view illustrating an organic EL display device 50b of the present embodiment, and is a diagram corresponding to FIG. 4. FIG. 13A is an enlarged view of a portion A2 illustrated in FIG. 12 of a case where a foreign matter exists in the portion A2. FIG. 13B is a plan view illustrating the foreign matter and the foreign-matter contact portion illustrated in FIG. 13A. In the following embodiments, parts identical to those in FIGS. 1 to 10 are designated by the same reference characters, and their detailed descriptions are omitted here.

The description of the first embodiment is based on the organic EL display device 50a where the end faces of the organic EL layer 20 are covered by the sealing film 22a whereas the description of the present embodiment is based on the organic EL display device 50b where the end faces of the organic EL layer 20 are covered by the inorganic barrier film 23.

As illustrated in FIG. 12, the organic EL display device 50b includes: a base substrate 10; a plurality of organic EL elements 8; a plurality of sealing films 22b; an inorganic barrier film 23; an adhesive layer 30; and a function layer 40. Each of the organic EL elements 8 is formed over the base substrate 10, and in between are structures from a moisture-proof film 11 to interlayer insulating films 17. Each of the plurality of sealing films 22b is formed on the corresponding one of the organic EL elements 8. The inorganic barrier film 23 covers the individual sealing films 22b. The function layer 40 is formed over inorganic barrier film 23 with the adhesive layer 30 provided in between.

In addition, for example, as illustrated in FIG. 13A and FIG. 13B, in a case where a foreign matter R exists on the second electrode 21a (on the organic EL element 8), the sealing film 22b includes a first sealing layer 22b1 that is layered on the second electrode 21a, and also includes a foreign-matter contact portion 22br that is configured to contact the foreign matter R. To put it differently, suppose a case where while an organic EL display device 50b is being manufactured, at least one foreign matter R exists in at least any one position on the organic EL element 8 in the organic EL display device 50b as illustrated in the enclosure A2 in FIG. 12. In this case, one foreign-matter contact portion 22br is formed in the sealing film 22b for each place where a foreign matter R exists.

In addition, as illustrated in FIG. 13A, the foreign-matter contact portion 22br is configured to surround the foreign matter R and to contact at least a surface portion Rt of the foreign matter R located on the organic EL element 8 side of the foreign matter R. In addition, in the sealing film 22b, the foreign-matter contact portion 22br and the first sealing layer 22b1 wrap up the foreign matter R. Note that the first sealing layer 22b1 is formed, for example, of a single layer film or a layered film of inorganic materials such as a silicon oxide film, a silicon nitride film, and a silicon oxynitride film. Note that the present embodiment is based on a case where the first sealing layer 22b1 is formed of an inorganic film, but that the first sealing layer 22b1 may be a layered film including not only one or more of the above-mentioned inorganic films and an organic film that is layered on the inorganic film. The organic film may be formed from acrylate, polyurea, parylene, polyimide, polyamide, or the like. In addition, the foreign-matter contact portion 22br includes one of the above-mentioned organic films.

As illustrated in FIG. 12, the inorganic barrier film 23 is in contact with the perimeter edge surface of each organic EL layer 20 and with the perimeter edge surface of each sealing film 22b. In addition, the inorganic barrier film 23 is formed, for example, of an aluminum oxide film formed by an atomic layer deposition (ALD) method. Note that the atomic layer deposition method is a film formation method where reaction products are deposited one layer of atoms after another by repeating a cycle including an adsorption and reaction process of molecules of film-formation materials (precursors) on a surface of a substrate placed in a vacuum chamber, and a subsequent purging process by use of an inert gas to remove excess of molecules. The film formed by the atomic layer deposition method is very thin (approximately 10 nm), but is uniform and has an excellent coatability.

The organic EL display device 50*b* with the above-described configuration, as in the case of the organic EL display device 50*a* of the first embodiment, is configured to display images by making the light-emitting layers 3 of the organic EL layers 20 in each of the subpixels P emit light appropriately.

The organic EL display device 50*b* of the present embodiment can be manufactured by modifying the manufacturing method described in the first embodiment. Specifically, a conductive film that is to be the second electrodes 21*a* and inorganic film that is to be the sealing films 22*b* are formed on the entire substrate where organic EL layers 20. Then, the conductive film and the inorganic film are etched by use of buffered hydrofluoric acid and thus are patterned to form second electrodes 21*a* and sealing films 22*b*. In addition, by an ALD method an inorganic barrier film 23 is formed to cover the sealing film 22*b*. Then, as in the manufacturing method described in the first embodiment, a process of affixing the function layer 40 via the adhesive layer 30 and the subsequent processes are performed.

The organic EL display device 50*b* of the present embodiment described above can have the following effect (3), in addition to the above-described effects (1) and (2).

Now, a detail description will be given below about the item (1). In the sealing film 22*b*, the grooves C are formed between every two adjacent ones of the plurality of subpixels P. Hence, the organic EL display device 50*b* has a smaller rigidity at portions between two adjacent ones of the plurality of subpixels P where the grooves C are formed. Hence, in a case where the organic EL display device 50*b* is bent around a bent axis that is parallel to the data lines 15*a*, in the organic EL display device 50*b*, a larger bending strain is generated in the outer portions of the subpixel P where the grooves C are formed whereas a smaller bending strain is generated in the inner portions of the subpixel P where no grooves C are formed. Hence, as the sealing film 22*b* has a smaller strain, the generation of cracks in the sealing film 22*b* can be suppressed. Accordingly, when the organic EL display device 50*b* is bent, the generation of cracks in the sealing film 22*b* is suppressed. In addition, as the generation of cracks in the sealing film 22*b* can be suppressed, the sealing film 22*b* has an improved sealing performance, and thus the organic EL display device 50*b* becomes more reliable.

(2) In addition, the foreign-matter contact portion 22*br* that contacts the foreign matter R existing on the organic EL element 8 is formed in the sealing film 22*b*. Hence, even in the case where a foreign matter R exists on the organic EL element 8, the generation of cracks in the sealing film 22*b* can be suppressed, and thus the organic EL display device 50*b* becomes more reliable. In addition, the foreign-matter contact portion 22*br* is formed to contact at least the surface portion Rt of the foreign matter R located on the organic EL element 8 side of the foreign matter R. Hence, the foreign-matter contact portion 22*br* can suppress the stress from the foreign matter R to the organic EL element 8 side when the organic EL display device 50*b* is bent. In addition, the existence of the foreign-matter contact portion 22*br* in the sealing film 22*b* allows the first sealing layer 22*b*1 and thus the sealing film 22*b* to be formed without causing faults. Hence, even in the case where a foreign matter R exists, the sealing performance for the organic EL element 8 can be prevented from being impaired, and thus the organic EL element 8 can be more reliable.

(3) Even in a case where the perimeter edge surface of each organic EL layer 20 and at least a part of the perimeter edge surface of the sealing film 22*b* overlap each other, the inorganic barrier film 23 covering each of the sealing films 22*b* can prevent the organic EL element 8 from being degraded. In addition, the inorganic barrier film 23 is thinner than and has a better coatability than the sealing film 22*b*. Hence, the sealing ability can be prevented from being impaired while the flexibility of the organic EL display device 50*b* can be improved.

Third Embodiment

FIG. 14 to FIG. 16B illustrate the third embodiment of an organic EL display device according to the disclosure. FIG. 14 is a plan view illustrating an arrangement structure of sealing films 22*c* in an organic EL display device 50*c* according to the present embodiment. In addition, FIG. 15 is a plan view illustrating an arrangement structure of second electrodes 21*c* in the organic EL display device 50*c*. In addition, FIG. 16A is an enlarged schematic view illustrating a foreign matter existing in the organic EL display device 50*c* according to the third embodiment of the disclosure and a portion around the foreign matter. FIG. 16B is a plan view illustrating the foreign matter and the foreign-matter contact portion illustrated in FIG. 16A.

The description in Embodiment 1 is based on a case of the organic EL display device 50*a* where the sealing films 22*a* extend in parallel to the data lines 15*a* whereas the description in the second embodiment is based on a case of the organic EL display device 50*b* where the sealing films 22*b* extend in parallel to the data lines 15*a*. The description in the present embodiment is based on a case of the organic EL display device 50*c* where the sealing films 22*c* extend in parallel to gate lines 12*a*.

The organic EL display device 50*c* includes: a base substrate 10; a plurality of organic EL elements 8; the plurality of sealing films 22*c*; an adhesive layer 30; and a function layer 40. Each of the organic EL elements 8 is formed over the base substrate 10, and in between are structures from a moisture-proof film 11 to interlayer insulating films 17. Each of the plurality of sealing films 22*c* is formed on the corresponding one of the organic EL elements 8. The function layer 40 is formed over the plurality of sealing films 22*c* with the adhesive layer 30 provided in between.

The organic EL element 8 includes: a plurality of first electrodes 18, a plurality of edge covers 19, a plurality of organic EL layers 20, and a plurality of second electrodes 21*c*. All of these components are formed in this order one upon another on and over the interlayer insulating films 17. Note that as illustrated in FIG. 15, the plurality of second electrodes 21*c* are formed extending in parallel to one another in the horizontal direction in FIG. 15. In addition, as illustrated in FIG. 15, each of the second electrodes 21*c* has an elongated rectangular shape in a plan view and thus is laid over the organic EL layers 20 of all the subpixels P that are arranged in a single horizontal line in FIG. 15. To put it differently, each of the second electrodes 21*c* is electrically connected to the corresponding subpixels P arranged in a horizontal single line in FIG. 15 and configured to display the grayscale of different colors from one another. When one of the second electrodes 21*c* is connected to a particular subpixel P, that one of the second electrodes 21*c* is connected to none of the two subpixels P that are adjacent to the particular subpixel in the horizontal vertical and that are configured to display the grayscale of the same color as the color of that particular subpixel P. In addition, as illustrated in FIG. 15, in the non-display region, the second electrodes 21c are connected to a common wiring line 15e via contact holes Hb formed in the passivation film 16. The common wiring line 15e is made of the same material as the material of the data lines 15a and is formed in the same layer where the data lines 15a are formed. The second electrode 21c functions to inject electrons into the organic EL layer 20, and is made from the same material as the material for the second electrode 21a described in the first embodiment.

As illustrated in FIG. 14, the plurality of sealing films 22c are formed extending in parallel to one another in the horizontal direction in FIG. 14. In addition, the sealing films 22c are formed on the corresponding second electrodes 21c, respectively. Each of the sealing films 22c has an elongated rectangular shape in a plan view and thus covers the end faces of the organic EL layers 20 of all the subpixels P that are arranged in a single horizontal line in FIG. 14. In addition, as illustrated in FIG. 14, the grooves C are formed between every two adjacent ones of the plurality of sealing films 22c. Each of the grooves C extends in the horizontal direction in FIG. 14 between the corresponding two subpixels P. In addition, the sealing films 22c have a function to protect the organic EL layers 20 from moisture and oxygen.

In addition, for example, as illustrated in FIG. 16A and FIG. 16B, in a case where a foreign matter R exists on the second electrode 21a (on the organic EL element 8), the sealing film 22c includes a first sealing layer 22c1 that is layered on the second electrode 21a, and also includes a foreign-matter contact portion 22cr that is configured to contact the foreign matter R. To put it differently, suppose a case where while an organic EL display device 50c is being manufactured, at least one foreign matter R exists in at least any one position on the second electrode 21a (on the organic EL element 8) in the organic EL display device 50c as illustrated in FIG. 16A. In this case, one foreign-matter contact portion 22cr is formed in the sealing film 22c for each place where a foreign matter R exists.

In addition, as illustrated in FIG. 16A, the foreign-matter contact portion 22cr is configured to surround the foreign matter R and to contact at least a surface portion Rt of the foreign matter R located on the organic EL element 8 side of the foreign matter R. In addition, in the sealing film 22c, the foreign-matter contact portion 22cr and the first sealing layer 22c1 wrap up the foreign matter R. Note that the first sealing layer 22c1 is formed, for example, of a single layer film or a layered film of inorganic materials such as a silicon oxide film, a silicon nitride film, and a silicon oxynitride film. Note that the present embodiment is based on a case where the first sealing layer 22c1 is formed of an inorganic film, but that the first sealing layer 22c1 may be a layered film including not only one or more of the above-mentioned inorganic films and an organic film that is layered on the inorganic film. The organic film may be formed from acrylate, polyurea, parylene, polyimide, polyamide, or the like. In addition, the foreign-matter contact portion 22cr includes one of the above-mentioned organic films.

The organic EL display device 50c with the above-described configuration, as in the case of the organic EL display device 50a of the first embodiment, is configured to display images by making the light-emitting layers 3 of the organic EL layers 20 in each of the subpixels P emit light appropriately.

The organic EL display device 50c of the present embodiment can be manufactured by a modified version of the manufacturing method described earlier in the first embodiment. In the present embodiment, the pattern shape used in the formation of the second electrode 21a and sealing film 22a is modified to form the second electrode 21c and the sealing film 22c.

The organic EL display device 50c of the present embodiment described above can have the above-described effects (1) and (2).

Now, a detail description will be given below about the item (1). In the sealing film 22c, the grooves C are formed between every two adjacent ones of the plurality of subpixels P. Hence, the organic EL display device 50c has a smaller rigidity at portions between two adjacent ones of the plurality of subpixels P where the grooves C are formed. Hence, in a case where the organic EL display device 50c is bent around a bent axis that is parallel to the gate lines 12a, in the organic EL display device 50c, a larger bending strain is generated in the outer portions of the subpixel P where the grooves C are formed whereas a smaller bending strain is generated in the inner portions of the subpixel P where no grooves C are formed. Hence, as the sealing film 22c has a smaller strain, the generation of cracks in the sealing film 22c can be suppressed. Accordingly, when the organic EL display device 50c is bent, the generation of cracks in the sealing film 22c is suppressed. In addition, as the generation of cracks in the sealing film 22c can be suppressed, the sealing film 22c has an improved sealing performance, and thus the organic EL display device 50c becomes more reliable.

(2) In addition, the foreign-matter contact portion 22cr that contacts the foreign matter R existing on the organic EL element 8 is formed in the sealing film 22c. Hence, even in the case where a foreign matter R exists on the organic EL element 8, the generation of cracks in the sealing film 22c can be suppressed, and thus the organic EL display device 50c becomes more reliable. In addition, the foreign-matter contact portion 22cr is formed to contact at least the surface portion Rt of the foreign matter R located on the organic EL element 8 side of the foreign matter R. Hence, the foreign-matter contact portion 22cr can suppress the stress from the foreign matter R to the organic EL element 8 side when the organic EL display device 50c is bent. In addition, the existence of the foreign-matter contact portion 22cr in the sealing film 22c allows the first sealing layer 22c1 and thus the sealing film 22c to be formed without causing faults. Hence, even in the case where a foreign matter R exists, the sealing performance for the organic EL element 8 can be prevented from being impaired, and thus the organic EL element 8 can be more reliable.

Fourth Embodiment

FIG. 17 to FIG. 21B illustrate the fourth embodiment of an organic EL display device according to the disclosure. FIG. 17 is a plan view illustrating an arrangement structure of sealing films 22d in an organic EL display device 50d according to the present embodiment. In addition, FIG. 18 is a plan view illustrating an arrangement structure of second electrodes 21d in the organic EL display device 50d. In addition, FIG. 19A is an enlarged schematic view illustrating a foreign matter existing in the organic EL display device 50d according to the fourth embodiment of the disclosure and a portion around the foreign matter. FIG. 19B is a plan view illustrating the foreign matter and the foreign-matter contact portion illustrated in FIG. 19A. In addition, FIG. 20 is a plan view illustrating a connection structure for second electrodes 22e in an organic EL display device 50e of a modified example of the organic EL display device 50d. In addition, FIG. 21A is an enlarged schematic view illustrating a foreign matter existing in the modified example of the organic EL display device 50d according to the fourth embodiment of the disclosure and a portion around the foreign matter. FIG. 21B is a plan view illustrating the foreign matter and the foreign-matter contact portion illustrated in FIG. 21A.

The descriptions in the first to third embodiments are based on cases of organic EL display devices 50a to 50c, respectively, where the plurality of sealing films 22a, 22b, and 22c, respectively, extend in parallel to one another. The description in the present embodiment is based on a case of the organic EL display device 50d where the plurality of sealing films 22d are arranged in a matrix shape.

The organic EL display device 50d includes: a base substrate 10; a plurality of organic EL elements 8; the plurality of sealing films 22d; an adhesive layer 30; and a function layer 40. Each of the organic EL elements 8 is formed over the base substrate 10, and in between are structures from a moisture-proof film 11 to interlayer insulating films 17. Each of the plurality of sealing films 22d is formed on the corresponding one of the organic EL elements 8. The function layer 40 is formed over the plurality of sealing films 22c with the adhesive layer 30 provided in between.

The organic EL element 8 includes: a plurality of first electrodes 18, a plurality of edge covers 19, a plurality of organic EL layers 20, and a plurality of second electrodes 21d. All of these components are formed in this order one upon another on and over the interlayer insulating films 17. Note that the plurality of second electrodes 21d are arranged in a matrix shape as illustrated in FIG. 18. In addition, as illustrated in FIG. 18, each of the second electrodes 21d has a rectangular shape in a plan view and is laid over the organic EL layer 20 of the corresponding one of the subpixels P. To put it differently, when one of the second electrodes 21d is electrically connected to a particular subpixel P, that one of the second electrodes 21d is electrically connected to none of the two subpixels P that are adjacent in the vertical direction to the particular subpixel P in FIG. 18 and that are configured to display the grayscale of the same color. In addition, when one of the second electrodes 21d is electrically connected to a particular subpixel P, that one of the second electrodes 21a is connected to none of the two subpixels P that are adjacent in the horizontal direction to the particular subpixel P in FIG. 18 and that are configured to display the grayscale of different colors from the color of that particular subpixel P. In addition, as illustrated in FIG. 18, the second electrodes 21d are connected to one of common wiring lines 18a via contact holes Hc formed in the edge covers 19. The common wiring lines 18a are made of the same material as the material of the first electrodes 18 and is formed in the same layer where the first electrodes 18 are formed. The second electrode 21d functions to inject electrons into the organic EL layer 20, and is made from the same material as the material for the second electrode 21a described in the first embodiment. Note that the common wiring lines 18a are laid over the corresponding gate lines 12a.

The plurality of sealing films 22d are arranged in a matrix shape as illustrated in FIG. 17 and FIG. 18. In addition, as illustrated in FIG. 17 and FIG. 18, the sealing films 22d are formed on the corresponding second electrodes 21d, respectively. Each of the sealing films 22d has a rectangular shape in a plan view and thus covers the end faces of the organic EL layer 20 of the corresponding one of the subpixels P. In addition, as illustrated in FIG. 17, the grooves C extending between every two subpixels P are formed in a matrix shape. In addition, the sealing films 22d have a function to protect the organic EL layers 20 from moisture and oxygen.

In addition, for example, as illustrated in FIG. 19A and FIG. 19B, in a case where a foreign matter R exists on the second electrode 21a (on the organic EL element 8), the sealing film 22d includes a first sealing layer 22d1 that is layered on the second electrode 21a, and also includes a foreign-matter contact portion 22dr that is configured to contact the foreign matter R. To put it differently, suppose a case where while an organic EL display device 50d is being manufactured, at least one foreign matter R exists in at least any one position on the second electrode 21a (on the organic EL element 8) in the organic EL display device 50d as illustrated in FIG. 19A. In this case, one foreign-matter contact portion 22dr is formed in the sealing film 22d for each place where a foreign matter R exists.

In addition, as illustrated in FIG. 19A, the foreign-matter contact portion 22dr is configured to surround the foreign matter R and to contact at least a surface portion Rt of the foreign matter R located on the organic EL element 8 side of the foreign matter R. In addition, in the sealing film 22d, the foreign-matter contact portion 22dr and the first sealing layer 22d1 wrap up the foreign matter R. Note that the first sealing layer 22d1 is formed, for example, of a single layer film or a layered film of inorganic materials such as a silicon oxide film, a silicon nitride film, and a silicon oxynitride film. Note that the present embodiment is based on a case where the first sealing layer 22d1 is formed of an inorganic film, but that the first sealing layer 22d1 may be a layered film including not only one or more of the above-mentioned inorganic films and an organic film that is layered on the inorganic film. The organic film may be formed from acrylate, polyurea, parylene, polyimide, polyamide, or the like. In addition, the foreign-matter contact portion 22dr includes one of the above-mentioned organic films.

The organic EL display device 50d with the above-described configuration, as in the case of the organic EL display device 50a of the first embodiment, is configured to display images by making the light-emitting layers 3 of the organic EL layers 20 in each of the subpixels P emit light appropriately.

The organic EL display device 50d of the present embodiment can be manufactured by a modified version of the manufacturing method described earlier in the first embodiment. In the present embodiment, the pattern shape used in the formation of the second electrode 21a and sealing film 22a is modified to form the second electrode 21d and the sealing film 22d. Note that according to the method of manufacturing the organic EL display device 50d in the present embodiment, the second electrodes 21d and the sealing films 22d are separately formed. It is, however, allowed to manufacture an organic EL display device 50e by forming the second electrodes 21e and sealing films 22e simultaneously (see FIG. 20). Specifically, as in the case of the manufacturing method described earlier in the second embodiment, a conductive film that is to be the second electrodes 21e and an inorganic film that is to be the sealing films 22e are formed on the entire substrate where organic EL layers 20. Then, the conductive film and the inorganic film are etched by use of buffered hydrofluoric acid and thus are patterned to form second electrodes 21e and sealing films 22e. Note that not only the second electrodes 21e and the sealing films 22e but also the organic EL layers 20 may be formed by performing an etching process using the buffered hydrofluoric acid. Then, the perimeter edge surface of each of the plurality of organic EL layers 20 and the perimeter edge surface of the corresponding one of the sealing films 22e that have been divided into the plurality units may be laid one upon the other.

In addition, for example, as illustrated in FIG. 21A and FIG. 21B, in a case where a foreign matter R exists on the second electrode 21a (on the organic EL element 8), the sealing film 22e includes a first sealing layer 22e1 that is layered on the second electrode 21a, and also includes a foreign-matter contact portion 22er that is configured to contact the foreign matter R. To put it differently, suppose a case where while an organic EL display device 50e is being manufactured, at least one foreign matter R exists in at least any one position on the second electrode 21a (on the organic EL element 8) in the organic EL display device 50e as illustrated in FIG. 21A. In this case, one foreign-matter contact portion 22er is formed in the sealing film 22e for each place where a foreign matter R exists.

In addition, as illustrated in FIG. 21A, the foreign-matter contact portion 22er is configured to surround the foreign matter R and to contact at least a surface portion Rt of the foreign matter R located on the organic EL element 8 side of the foreign matter R. In addition, in the sealing film 22e, the foreign-matter contact portion 22er and the first sealing layer 22e1 wrap up the foreign matter R. Note that the first sealing layer 22e1 is formed, for example, of a single layer film or a layered film of inorganic materials such as a silicon oxide film, a silicon nitride film, and a silicon oxynitride film. Note that the present embodiment is based on a case where the first sealing layer 22e1 is formed of an inorganic film, but that the first sealing layer 22e1 may be a layered film including not only one or more of the above-mentioned inorganic films and an organic film that is layered on the inorganic film. The organic film may be formed from acrylate, polyurea, parylene, polyimide, polyamide, or the like. In addition, the foreign-matter contact portion 22er includes one of the above-mentioned organic films.

The organic EL display devices 50d and 50e of the present embodiment described above can have the above-described effects (1) and (2).

Now, a detail description will be given below about the item (1). In each of the sealing films 22d and 22e, the grooves C are formed in a lattice pattern, extending between every two adjacent ones of the plurality of subpixels P. Hence, each of the organic EL display devices 50d and 50e has a smaller rigidity at portions between two adjacent ones of the plurality of subpixels P where the grooves C are formed. Hence, in a case where each of the organic EL display devices 50d and 50e is bent around a bent axis that is parallel to the gate lines 12a or the data lines 15a, in each of the organic EL display devices 50d and 50e, a larger bending strain is generated in the outer portions of the subpixel P where the grooves C are formed whereas a smaller bending strain is generated in the inner portions of the subpixel P where no grooves C are formed. Hence, as each of the sealing films 22d and 22e has a smaller strain, the generation of cracks in each of the sealing films 22d and 22e can be suppressed. Accordingly, when each of the organic EL display devices 50d and 50e is bent, the generation of cracks in each of the sealing films 22d and 22e is suppressed. In addition, as the generation of cracks in each of the sealing films 22d and 22e can be suppressed, each of the sealing films 22d and 22e has an improved sealing performance, and thus the organic EL display devices 50d and 50e become more reliable.

(2) In addition, the foreign-matter contact portion 22dr and 22er each of which contacts the foreign matter R existing on the organic EL element 8 are formed respectively in the sealing films 22d and 22e. Hence, even in the case where a foreign matter R exists on the organic EL element 8, the generation of cracks in the sealing films 22d and 22e can be suppressed, and thus the organic EL display devices 50d and 50e become more reliable. In addition, each of the foreign-matter contact portions 22dr and 22er is formed to contact at least the surface portion Rt of the foreign matter R located on the organic EL element 8 side of the foreign matter R. Hence, each of the foreign-matter contact portions 22dr and 22er can suppress the stress from the foreign matter R to the organic EL element 8 side when each of the organic EL display device 50d and 50e is bent. In addition, the existence of each of the foreign-matter contact portions 22dr and 22er in the corresponding one of the sealing films 22d and 22e allows the first sealing layer 22d1 and thus the sealing film 22d as well as the first sealing layer 22e1 and thus the sealing film 22e to be formed without causing faults. Hence, even in the case where a foreign matter R exists, the sealing performance for the organic EL element 8 can be prevented from being impaired, and thus the organic EL element 8 can be more reliable.

Fifth Embodiment

Figure 22:
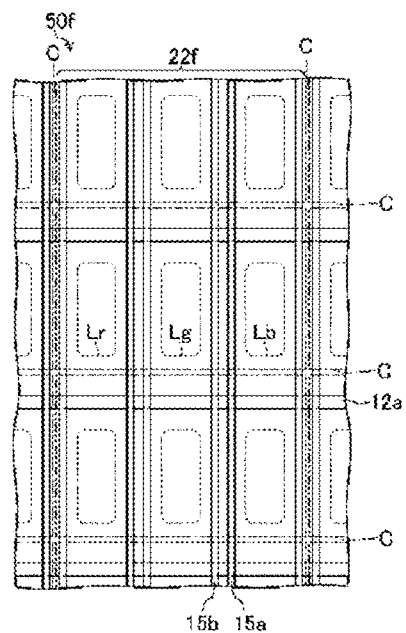
FIG. 22 is a plan view illustrating a sealing-film arrangement structure in an organic EL display device according to a fifth embodiment of the disclosure.
Figure 23:
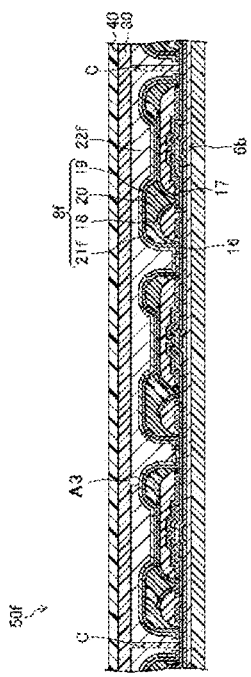
FIG. 23 is a cross-sectional view illustrating the organic EL display device according to the fifth embodiment of the disclosure, and is a diagram corresponding to FIG. 4.

FIG. 22 to FIG. 26B illustrate the fifth embodiment of an organic EL display device according to the disclosure. FIG. 22 is a plan view illustrating an arrangement structure of sealing films 22f in an organic EL display device 50f according to the present embodiment. FIG. 23 is a cross-sectional view illustrating the organic EL display device 50f, and is a diagram corresponding to FIG. 4. FIG. 24A is an enlarged view of a portion A3 illustrated in FIG. 23 of a case where a foreign matter exists in the portion A3. FIG. 24B is a plan view illustrating the foreign matter and the foreign-matter contact portion illustrated in FIG. 24A. FIG. 25 is a cross-sectional view illustrating an organic EL display device 50g according to a modified example of the organic EL display device 50f, and is a diagram corresponding to FIG. 4. FIG. 26A is an enlarged view of a portion A4 illustrated in FIG. 25 of a case where a foreign matter exists in the portion A4. FIG. 26B is a plan view illustrating the foreign matter and the foreign-matter contact portion illustrated in FIG. 26A.

The description in the fourth embodiment is based on a case of the organic EL display device 50d where one of the sealing films 22d is formed for the corresponding one of all the subpixels P. The description in the present embodiment is based on a case of the organic EL display device 50f where each of the sealing films 22f is formed for the corresponding three subpixels P that are adjacent to one another. Note that the description of the present embodiment is based on a case of the organic EL display device 50f where three subpixels P that are adjacent to one another together form a single pixel and where each sealing film 22f is formed for the corresponding one of the pixels thus formed. In an alternative configuration, a single pixel is formed by two subpixels P or more than three subpixels P that are adjacent to each other, and a sealing film is formed for each of the pixels thus formed.

As illustrated in FIG. 23, the organic EL display device 50f includes: a base substrate 10; a plurality of organic EL elements 8f; the plurality of sealing films 22f; an adhesive layer 30; and a function layer 40. Each of the organic EL elements 8f is formed over the base substrate 10, and in between are structures from a moisture-proof film 11 to interlayer insulating films 17. Each of the plurality of sealing films 22f is formed on the corresponding one of the organic EL elements 8. The function layer 40 is formed over the plurality of sealing films 22f with the adhesive layer 30 provided in between.

As illustrated in FIG. 23, the organic EL element 8f includes: a plurality of first electrodes 18, a plurality of edge covers 19, a plurality of organic EL layers 20, and a plurality of second electrodes 21f. All of these components are formed in this order one upon another on and over the interlayer insulating films 17. Note that the plurality of second electrodes 21f are formed extending in parallel to one another in the vertical direction in FIG. 22. In addition, each of the second electrodes 21f has an elongated rectangular shape in a plan view and thus is laid over the organic EL layers 20 of all the subpixels that are arranged in three vertical lines in FIG. 22 that are adjacent in horizontal direction in FIG. 22 to one another. Note that as illustrated in FIG. 23, each of the second electrodes 21f covers the end faces of the organic EL layers 20 of the subpixels P arranged in the inner-side one of the three adjacent lines of the subpixels P. In addition, in the non-display region, the second electrodes 21f are connected to a common wiring line via contact holes formed in a layered film of the gate insulating film 13 and the passivation film 16. The common wiring line is made of the same material as the material of the gate lines 12a and is formed in the same layer where the gate lines 12a are formed. Note that the second electrode 21f functions to inject electrons into the organic EL layer 20, and is made from the same material as the material for the second electrode 21a described in the first embodiment.

As illustrated in FIG. 22, the plurality of sealing films 22f are formed extending in parallel to one another in the vertical direction in FIG. 22. In addition, as illustrated in FIG. 22 and FIG. 23, each of the sealing films 22f has an elongated rectangular shape in a plan view and thus covers the second electrodes 21f and the end faces of the organic EL layers 20 exposed from the second electrodes 21f. In addition, as illustrated in FIGS. 22 and 23, in the plurality of sealing films 22f, the grooves C arranged in a lattice pattern are formed extending in both vertical and horizontal directions in FIG. 22. Each of the grooves C extends between the corresponding two subpixels P. In addition, the sealing films 22f have a function to protect the organic EL layers 20 from moisture and oxygen.

In addition, for example, as illustrated in FIG. 24A and FIG. 24B, in a case where a foreign matter R exists on the second electrode 21a (on the organic EL element 8), the sealing film 22f includes a first sealing layer 22f1 that is layered on the second electrode 21a, and also includes a foreign-matter contact portion 22fr that is configured to contact the foreign matter R. To put it differently, suppose a case where while an organic EL display device 50f is being manufactured, at least one foreign matter R exists in at least any one position on the second electrode 21a (on the organic EL element 8) in the organic EL display device 50f as illustrated in FIG. 24A. In this case, one foreign-matter contact portion 22fr is formed in the sealing film 22f for each place where a foreign matter R exists.

In addition, as illustrated in FIG. 24A, the foreign-matter contact portion 22fr is configured to surround the foreign matter R and to contact at least a surface portion Rt of the foreign matter R located on the organic EL element 8 side of the foreign matter R. In addition, in the sealing film 22f, the foreign-matter contact portion 22fr and the first sealing layer 22f1 wrap up the foreign matter R. Note that the first sealing layer 22f1 is formed, for example, of a single layer film or a layered film of inorganic materials such as a silicon oxide film, a silicon nitride film, and a silicon oxynitride film. Note that the present embodiment is based on a case where the first sealing layer 22f1 is formed of an inorganic film, but that the first sealing layer 22f1 may be a layered film including not only one or more of the above-mentioned inorganic films and an organic film that is layered on the inorganic film. The organic film may be formed from acrylate, polyurea, parylene, polyimide, polyamide, or the like. In addition, the foreign-matter contact portion 22fr includes one of the above-mentioned organic films.

The organic EL display device 50f with the above-described configuration, as in the case of the organic EL display device 50a of the first embodiment, is configured to display images by making the light-emitting layers 3 of the organic EL layers 20 in each of the subpixels P emit light appropriately.

The organic EL display device 50f of the present embodiment can be manufactured by a modified version of the manufacturing method described earlier in the first embodiment. In the present embodiment, the pattern shape used in the formation of the second electrode 21a and sealing film 22a is modified to form the second electrode 21f and the sealing film 22f.

Note that the description in the present embodiment is based on a case of the organic EL display device 50f including the interlayer insulating films 17 and the edge covers 19, both of which are separated for each one of the subpixels P adjacent to one another in the direction in which the gate lines 12a extend. An alternative organic EL display device 50g may include edge covers 19g which are separated for each three subpixels adjacent to one another in the direction in which the gate lines 12a extend.

Specifically, as illustrated in FIG. 25, the organic EL display device 50g includes: a base substrate 10; a plurality of organic EL elements 8g; the plurality of sealing films 22g; an adhesive layer 30; and a function layer 40. Each of the organic EL elements 8g is formed over the base substrate 10, and in between are structures from a moisture-proof film 11 to interlayer insulating films 17. Each of the plurality of sealing films 22g is formed on the corresponding one of the organic EL elements 8g. The function layer 40 is formed over the plurality of sealing films 22g with the adhesive layer 30 provided in between.

As illustrated in FIG. 25, the organic EL element 8g includes: a plurality of first electrodes 18, a plurality of edge covers 19g, a plurality of organic EL layers 20g, and a plurality of second electrodes 21g. All of these components are formed in this order one upon another on and over the interlayer insulating films 17g.

As illustrated in FIG. 25, the plurality of interlayer insulating film 17g are formed on the passivation film 16, and extend in parallel to one another in, for example, the vertical direction in FIG. 22. In addition, each of the interlayer insulating films 17g has an elongated rectangular shape in a plan view, and thus is laid over all the subpixels P that are arranged in vertical three lines that are adjacent, in the horizontal direction in FIG. 22, to one another, for example. The interlayer insulating film 17g includes, for example, a transparent organic resin material, such as an acrylic resin.

The plurality of edge covers 19g are formed, for example, extending in parallel to one another in the vertical direction in FIG. 22. In addition, as illustrated in FIG. 25, the edge covers 19g are arranged in a lattice pattern with n rows and 3 columns (where n is the number of the gate lines 12a), for example, and thus cover the edge portions of the first electrodes 18 of all the subpixels P that are arranged in vertical three lines that are adjacent, in the horizontal direction in FIG. 22, to one another. Note that each of the edge covers 19g may be, for example, an inorganic film or an organic film. Examples of materials that may be included in the inorganic film include silicon oxide ($SiO_2$), silicon nitride (SiNx (x is a positive number)) such as trisilicon tetranitride ($Si_3N_4$), and silicon oxynitride (SiNO). Examples of materials that may be included in the organic film include (photosensitive) polyimide resins, (photosensitive) acrylic resins, (photosensitive) polysiloxane resins, and novolak resins.

The plurality of organic EL layers 20g are included respectively in the individual subpixels P. The organic EL layers 20g are arranged in a matrix shape on the first electrodes 18 and the edge covers 19g. In addition, in each of the subpixels P, the organic EL layer 20g covers the first electrode 18 exposed from the edge covers 19g. As in the case of the organic EL layer 20 described earlier in the first embodiment, each of the organic EL layers 20g includes a hole injecting layer 1, a hole transport layer 2, a light-emitting layer 3, an electron transport layer 4, and an electron injecting layer 5, which are arranged in the order stated over the first electrode 18.

The plurality of second electrodes 21g are formed extending in parallel to one another in the vertical direction in FIG. 22, for example. In addition, each of the second electrodes 21g has an elongated rectangular shape in a plan view and thus is laid over the organic EL layers 20g of all the subpixels that are arranged in three vertical lines in FIG. 22 that are adjacent in horizontal direction in FIG. 22 to one another, for example. Note that as illustrated in FIG. 25, each of the second electrodes 21g covers the end faces of the organic EL layers 20g of the subpixels P arranged in the inner-side one of the three adjacent lines of the subpixels P. In addition, in the non-display region, the second electrodes 21g are connected to a common wiring line via contact holes formed in a layered film of the gate insulating film 13 and the passivation film 16. The common wiring line is made of the same material as the material of the gate lines 12a and is formed in the same layer where the gate lines 12a are formed. Note that the second electrode 21g functions to inject electrons into the organic EL layer 20g, and is made from the same material as the material for the second electrode 21a described in the first embodiment.

The plurality of sealing film 22g are formed extending in parallel to one another in the vertical direction in FIG. 22, for example. In addition, as illustrated in FIG. 22 and FIG. 25, each of the sealing films 22g has an elongated rectangular shape in a plan view and thus covers the second electrodes 21g and the end faces of the organic EL layers 20g exposed from the second electrodes 21g. In addition, as in the case of the sealing films 22f, in the plurality of sealing films 22g, the grooves C arranged in a lattice pattern are formed extending in both vertical and horizontal directions in FIG. 22. Each of the grooves C extends between the corresponding two subpixels P. In addition, the sealing films 22g have a function to protect the organic EL layers 20g from moisture and oxygen.

In addition, for example, as illustrated in FIG. 26A and FIG. 26B, in a case where a foreign matter R exists on the second electrode 21a (on the organic EL element 8), the sealing film 22g includes a first sealing layer 22g1 that is layered on the second electrode 21a, and also includes a foreign-matter contact portion 22gr that is configured to contact the foreign matter R. To put it differently, suppose a case where while an organic EL display device 50g is being manufactured, at least one foreign matter R exists in at least any one position on the second electrode 21a (on the organic EL element 8) in the organic EL display device 50g as illustrated in FIG. 26A. In this case, one foreign-matter contact portion 22gr is formed in the sealing film 22g for each place where a foreign matter R exists.

In addition, as illustrated in FIG. 26A, the foreign-matter contact portion 22gr is configured to surround the foreign matter R and to contact at least a surface portion Rt of the foreign matter R located on the organic EL element 8 side of the foreign matter R. In addition, in the sealing film 22g, the foreign-matter contact portion 22gr and the first sealing layer 22g1 wrap up the foreign matter R. Note that the first sealing layer 22g1 is formed, for example, of a single layer film or a layered film of inorganic materials such as a silicon oxide film, a silicon nitride film, and a silicon oxynitride film. Note that the present embodiment is based on a case where the first sealing layer 22g1 is formed of an inorganic film, but that the first sealing layer 22g1 may be a layered film including not only one or more of the above-mentioned inorganic films and an organic film that is layered on the inorganic film. The organic film may be formed from acrylate, polyurea, parylene, polyimide, polyamide, or the like. In addition, the foreign-matter contact portion 22gr includes one of the above-mentioned organic films.

The organic EL display devices 50f and 50g of the present embodiment described above can have the above-described effects (1) and (2).

Now, a detail description will be given below about the item (1). In each of the sealing films 22f and 22g, the grooves C are formed in a lattice pattern, extending between every two adjacent ones of the plurality of subpixels P. Hence, each of the organic EL display devices 50f and 50g has a smaller rigidity at portions between two adjacent ones of the plurality of subpixels P where the grooves C are formed. Hence, in a case where each of the organic EL display devices 50f and 50g is bent around a bent axis that is parallel to the gate lines 12a or the data lines 15a, in each of the organic EL display devices 50f and 50g, a larger bending strain is generated in the outer portions of the subpixel P where the grooves C are formed whereas a smaller bending strain is generated in the inner portions of the subpixel P where no grooves C are formed. Hence, as each of the sealing films 22f and 22g has a smaller strain, the generation of cracks in each of the sealing films 22f and 22g can be suppressed. Accordingly, when each of the organic EL display devices 50f and 50g is bent, the generation of cracks in each of the sealing films 22f and 22g is suppressed. In addition, as the generation of cracks in each of the sealing films 22f and 22g can be suppressed, each of the sealing films 22f and 22g has an improved sealing performance, and thus the organic EL display devices 50f and 50g become more reliable.

(2) In addition, the foreign-matter contact portion 22fr and 22gr each of which contacts the foreign matter R existing on the organic EL element 8 are formed respectively in the sealing films 22f and 22g. Hence, even in the case where a foreign matter R exists on the organic EL element 8, the generation of cracks in the sealing films 22f and 22g can be suppressed, and thus the organic EL display devices 50f and 50g become more reliable. In addition, each of the foreign-matter contact portions 22fr and 22gr is formed to contact at least the surface portion Rt of the foreign matter R located on the organic EL element 8 side of the foreign matter R. Hence, each of the foreign-matter contact portions 22fr and 22gr can suppress the stress from the foreign matter R to the organic EL element 8 side when each of the organic EL display device 50f and 50g is bent. In addition, the existence of each of the foreign-matter contact portions 22*fr* and 22*gr* in the corresponding one of the sealing films 22*f* and 22*g* allows the first sealing layer 22*f*1 and thus the sealing film 22*f* as well as the first sealing layer 22*g*1 and thus the sealing film 22*g* to be formed without causing faults. Hence, even in the case where a foreign matter R exists, the sealing performance for the organic EL element 8 can be prevented from being impaired, and thus the organic EL element 8 can be more reliable.

Sixth Embodiment

Figure 27:
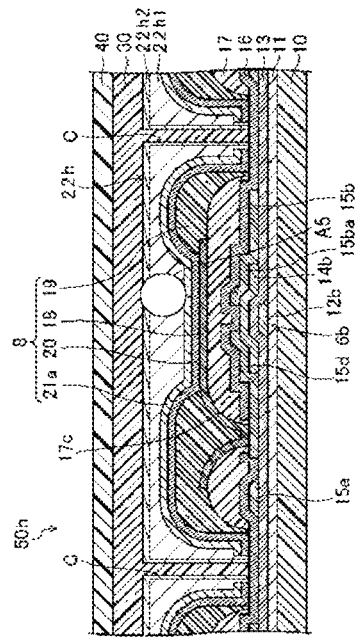
FIG. 27 is a cross-sectional view illustrating an organic EL display device according to a sixth embodiment of the disclosure, and is a diagram corresponding to FIG. 4.
Figure 28A:
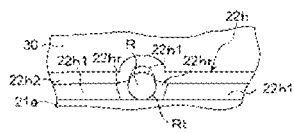
FIG. 28A is an enlarged view of a portion A5 illustrated in FIG. 27 of a case where a foreign matter exists in the portion A5.
Figure 28B:
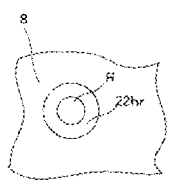
FIG. 28B is a plan view illustrating the foreign matter and the foreign-matter contact portion illustrated in FIG. 28A.

FIG. 27 to FIG. 28B illustrate the sixth embodiment of an organic EL display device according to the disclosure. FIG. 27 is a cross-sectional view illustrating an organic EL display device 50*h* according to the sixth embodiment of the disclosure, and is a diagram corresponding to FIG. 4. FIG. 28A is an enlarged view of a portion A5 illustrated in FIG. 27 of a case where a foreign matter exists in the portion A5. FIG. 28B is a plan view illustrating the foreign matter and the foreign-matter contact portion illustrated in FIG. 28A.

The description of the first embodiment is based on the organic EL display device 50*a* including the sealing film 22*a* including: the foreign-matter contact layer 22*ar*0 formed first; and the first sealing layer 22*a*1 formed after that. The description of the present embodiment is based on a case of the organic EL display device 50*h* including a sealing film 22*h* including: a first sealing layer 22*h*1 formed first; a foreign-matter contact layer 22*hr*0 formed secondly; and a second sealing layer 22*h*2 formed after that.

As illustrated in FIG. 27, the organic EL display device 50*h* includes: a base substrate 10; a plurality of organic EL elements 8; the plurality of sealing films 22*h*; an adhesive layer 30; and a function layer 40. Each of the organic EL elements 8 is formed over the base substrate 10, and in between are structures from a moisture-proof film 11 to interlayer insulating films 17. Each of the plurality of sealing films 22*h* is formed on the corresponding one of the organic EL elements 8. The function layer 40 is formed over the plurality of sealing films 22*h* with the adhesive layer 30 provided in between.

As in the cases of each of the embodiments described so far, each of the organic EL elements 8 included in the organic EL display device 50*h* has end portions each of which has a certain taper angle with respect to the base substrate 10. The certain taper angle is not larger than a predetermined angle (the details of this taper angle will be described later).

As in the case of the sealing films 22*a* in the first embodiment, the plurality of sealing films 22*h* are formed extending in parallel to one another. In addition, as illustrated in FIG. 27, each of the sealing films 22*h* has an elongated rectangular shape in a plan view. Each of the sealing films 22*h* is formed on the second electrode 21*a* and thus is laid over the second electrode 21*a*. In addition, as illustrated in FIG. 27, in the plurality of sealing films 22*h*, grooves C extending between every two mutually adjacent subpixels P are formed.

In addition, for example, as illustrated in FIG. 28A and FIG. 28B, in a case where a foreign matter R exists on the second electrode 21*a* (on the organic EL element 8), each of the sealing films 22*h* includes: a first sealing layer 22*h*1 that is layered on both the second electrode 21*a* and the foreign matter R; a foreign-matter contact portion 22*hr* that is configured to contact the foreign matter R; and a second sealing layer 22*h*2 that is layered on both the first sealing layer 22*h*1 and the foreign-matter contact layer 22*hr*. To put it differently, suppose a case where while an organic EL display device 50*h* is being manufactured, at least one foreign matter R exists in at least any one position on the organic EL element 8 in the organic EL display device 50*h* as illustrated in the enclosure A5 in FIG. 27. In this case, one foreign-matter contact portion 22*hr* is formed in the sealing film 22*h* for each place where a foreign matter R exists. In addition, the foreign-matter contact portion 22*hr* has a larger taper angle than 90° with respect to the base substrate 10 as will be described in detail later.

In addition, as illustrated in FIG. 28A, the foreign-matter contact portion 22*hr* is configured to surround the foreign matter R and to contact at least a surface portion Rt of the foreign matter R located on the organic EL element 8 side of the foreign matter R. In addition, in the sealing film 22*h*, the foreign-matter contact portion 22*hr*, the first sealing layer 22*h*1, and second sealing layer 22*h*2 wrap up the foreign matter R. Note that each of the first sealing layer 22*h*1 and the second sealing layer 22*h*2 is formed, for example, of a single layer film or a layered film of inorganic materials such as a silicon oxide film, a silicon nitride film, and a silicon oxynitride film. Note that the present embodiment is based on a case where each of the first sealing layer 22*h*1 and the second sealing layer 22*h*2 is formed of an inorganic film, but that each of the first sealing layer 22*h*1 and the second sealing layer 22*h*2 may be a layered film including not only one or more of the above-mentioned inorganic films and an organic film that is layered on the inorganic film. The organic film may be formed from acrylate, polyurea, parylene, polyimide, polyamide, or the like. In addition, the foreign-matter contact portion 22*hr* includes one of the above-mentioned organic films.

Figure 29:
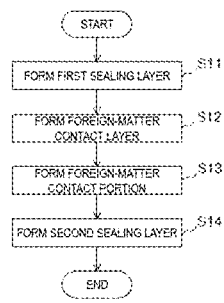
FIG. 29 is a flowchart describing steps of manufacturing main portions of the organic EL display device according to the sixth embodiment of the disclosure.

With reference to FIG. 29 and FIGS. 30A to 30F, a description will be given below about a specific method of forming the sealing films 22*h* of a case where a foreign matter R exists on the organic EL element 8. FIG. 29 is a flowchart describing steps of manufacturing main portions of the organic EL display device 50*h* according to the sixth embodiment of the disclosure. FIGS. 30A to 30F are diagrams describing a series of main steps of manufacturing the main portions of the organic EL display device 50*h* according to the sixth embodiment of the disclosure. Note that the following description is based on a case where the foreign-matter contact portions 22*hr* are formed by use of an organic film whereas the first sealing layers 22*h*1 and the second sealing layer 22*h*2 are formed by use of an inorganic film.

Figure 30A:
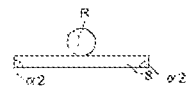
FIGS. 30A to 30F are diagrams describing a series of main steps of manufacturing the main portions of the organic EL display device according to the sixth embodiment of the disclosure.
Figure 30B:
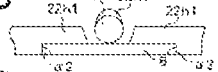

As illustrated in Step S11 of FIG. 29, a process of forming the first sealing layer 22*h*1 as an inorganic film is performed as the first one of all the components in the sealing film 22*h*. For example, this formation process is performed by a well-known CVD method using, for example, an open mask or an FMM mask. Thus, the first sealing layer 22*h*1 is formed on the organic EL element 8. Note that as illustrated in FIG. 30A, in a case where a foreign matter R exists on the organic EL element 8, the first sealing layer 22*h*1 is formed on the organic EL element 8 with a gap left between itself and the foreign matter R, and is also formed on the foreign matter R, as illustrated in FIG. 30B.

In addition, as described earlier, in the organic EL element 8, with respect to the base substrate 10 (FIG. 27), the taper angle (denoted by "α2" in FIGS. 30A to 30F) of each end portion of the organic EL element 8 is set to an angle that is equal to or smaller than a predetermined angle (e.g., 30°). To put it differently, in the organic EL element 8, the organic EL layer 20 and the second electrode 21*a* are formed with end faces of the organic EL layer 20 and the second electrode 21*a* having angles with respect to the base substrate 10 that are equal to or smaller than the predetermined angle in FIG. 27, for example. Hence, in the present embodiment, the organic EL element 8 is prevented from being degraded by moisture (details of which will be described later).

Figure 30C:
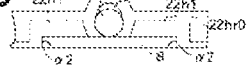

Then, as illustrated in Step S12 of FIG. 29, the foreign-matter contact layer made of an organic film is formed to cover the organic EL elements 8 and the first sealing layer 22$h$1 by a well-known method. Specifically, as illustrated in FIG. 30C, the foreign-matter contact layer 22$hr$0 covers the first sealing layer 22$h$1, and fills the gap left between the foreign matter R and the first sealing layer 22$h$1 on the organic EL element 8. Specifically, for example, a liquid organic material for the organic film is processed by a vapor deposition method to form the foreign-matter contact layer 22$hr$0 on the foreign matter R, the organic EL element 8, and the first sealing layer 22$h$1. Then, the foreign-matter contact layer 22$hr$0 is subjected, for example, to a UV irradiation process, and thus the foreign-matter contact layer 22$hr$0 is hardened on the foreign matter R, the organic EL element 8, and the first sealing layer 22$h$1. In addition, the foreign-matter contact portion 22$hr$ is formed on the organic EL element 8 with the taper angle (denoted by "β2" in FIGS. 30D to 30F) of the foreign-matter contact portion 22$hr$ with respect to the base substrate 10 being larger than 90°, for example.

Figure 30D:
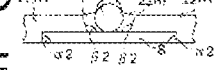

Then, as illustrated in Step S13 of FIG. 29, by performing a known ashing process on the foreign-matter contact layer 22$hr$0, the foreign-matter contact portion 22$hr$ is formed on the organic EL element 8. To put it differently, as a portion of the foreign-matter contact layer 22$hr$0 has not been removed due to the existence of the foreign matter R, that portion is formed as the foreign-matter contact portion 22$hr$ by performing the ashing process as illustrated in FIG. 30D. To put it differently, the foreign-matter contact portion 22$hr$ is formed by allowing some portions of the foreign-matter contact layer 22$hr$0 located around the foreign matter R and filling the gap to be left not removed (see also FIG. 28B). In addition, in a case of no foreign matter R existing on the organic EL element 8, the first sealing layer 22$h$1 is formed to cover the entire surfaces of the organic EL element 8 without any such gaps as described above. The foreign-matter contact layer 22$hr$0 is completely removed by the ashing process, and thus no foreign-matter contact portion 22$hr$ is formed in the sealing film 22$h$.

Figure 30E:
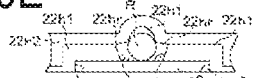
Figure 30F:
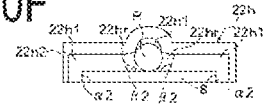

Then, a process of forming the second sealing layer 22$h$2 is performed as illustrated in Step S14 of FIG. 29. This formation process is performed by a well-known CVD method using, for example, an open mask or an FMM mask. Thus, as illustrated in FIG. 30E, the second sealing layer 22$h$2 is formed to cover the first sealing layer 22$h$1 and the foreign-matter contact portion 22$hr$. Then, by performing a well-known etching process, the sealing films 22$h$ for individual subpixels P are formed as illustrated in FIG. 30F.

Comparative Example 2 where the taper angle α2 is larger than the predetermined angle has some problems, which are described specifically below with reference to FIGS. 31A to 31D. FIGS. 31A to 31D are diagrams describing a series of main steps of manufacturing main portions of an organic EL display device according to Comparative Example 2. Note that the following description is based on a case where the organic EL display device of Comparative Example 2 has a 90-degree taper angle α2 of each end portion of the organic EL element 8 with respect to the base substrate 10.

Figure 31A:
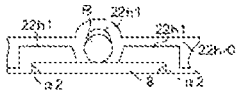
FIGS. 31A to 31D are diagrams describing a series of main steps of manufacturing main portions of an organic EL display device according to Comparative Example 2.
Figure 31B:
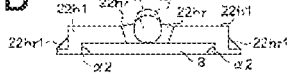

In the organic EL display device of Comparative Example 2, finishing the process in Step S12 leaves the foreign-matter contact layer 22$hr$0 formed on the organic EL element 8 and the first sealing layer 22$h$1 as illustrated in FIG. 31A. Then, the ashing in Step S13 leaves unremoved, as remaining portions 22$hr$1, part of the organic film of the foreign-matter contact layer 22$hr$0 located in the end portions of the organic EL element 8 as illustrated in FIG. 31B. These remaining portions 22$hr$1 are the result of the taper angle α2 that is larger than the predetermined angle (e.g., 30°).

Figure 31C:
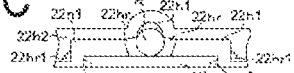
Figure 31D:
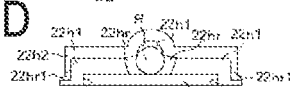

Then, finishing the process in Step S14, as illustrated in FIG. 31C, the second sealing layer 22$h$2 is formed on the first sealing layer 22$h$1, the foreign-matter contact portion 22$hr$ and the remaining portions 22$hr$1. Then, in a case where the sealing films are formed for individual subpixels P by a well-known etching process, the remaining portions 22$hr$1 may not be etched but exposed as illustrated in FIG. 31D. In a case where the remaining portions 22$hr$1 are exposed as described above, the remaining portions 22$hr$1 may absorb moisture through the adhesive layer 30, and the like. As a consequence, in Comparative Example 2, in a case where a foreign matter R exists near the remaining portion 22$hr$1, the moisture having been absorbed in remaining portions 22$hr$1 may permeate the organic EL element 8 through the remaining portions 22$hr$1 and the remaining portion 22$hr$1. The moisture may degrade the organic EL element 8.

In contrast, in the organic EL display device 50$h$ of the present embodiment, each end portion of the organic EL element 8 has a taper angle α2 that is equal to or smaller than the predetermined angle. Hence, finishing the ashing process leaves no remaining portions 22$hr$1 in the end portions of the organic EL element 8, and thus the foreign-matter contact layer 22$hr$0 other than the foreign-matter contact portion 22$hr$ can be removed by the ashing process. As a consequence, in the present embodiment, even in the case where a foreign matter R exists, consequences that are different from the consequences in Comparative Example 2 are produced. Specifically, the moisture is prevented from permeating the organic EL element 8 and the degradation of organic EL element 8 is prevented from being caused by the permeation of moisture. To put it differently, in the present embodiment, each end portion of the organic EL element 8 is formed to have the taper angle α2 that leaves no remaining portions 22$hr$1 in the end portions of the organic EL element 8 after the ashing process on the foreign-matter contact layer 22$hr$0.

The organic EL display device 50$h$ of the present embodiment described above can have the following effect (4), in addition to the above-described effects (1) and (2).

Now, a detail description will be given below about the item (1). In the sealing film 22$h$, the grooves C are formed between every two adjacent ones of the plurality of subpixels P. Hence, the organic EL display device 50$h$ has a smaller rigidity at portions between two adjacent ones of the plurality of subpixels P where the grooves C are formed. Hence, in a case where the organic EL display device 50$h$ is bent around a bent axis that is parallel to the gate lines 12$a$, in the organic EL display device 50$h$, a larger bending strain is generated in the outer portions of the subpixel P where the grooves C are formed whereas a smaller bending strain is generated in the inner portions of the subpixel P where no grooves C are formed. Hence, as the sealing film 22$h$ has a smaller strain, the generation of cracks in the sealing film 22$h$ can be suppressed. Accordingly, when the organic EL display device 50$h$ is bent, the generation of cracks in the sealing film 22$h$ is suppressed. In addition, as the generation of cracks in the sealing film 22$h$ can be suppressed, the sealing film 22$h$ has an improved sealing performance, and thus the organic EL display device 50$h$ becomes more reliable.

(2) In addition, the foreign-matter contact portion 22*hr* that contacts the foreign matter R existing on the organic EL element 8 is formed in the sealing film 22*h*. Hence, even in the case where a foreign matter R exists on the organic EL element 8, the generation of cracks in the sealing film 22*h* can be suppressed, and thus the organic EL display device 50*h* becomes more reliable. In addition, the foreign-matter contact portion 22*hr* is formed to contact at least the surface portion Rt of the foreign matter R located on the organic EL element 8 side of the foreign matter R. Hence, the foreign-matter contact portion 22*hr* can suppress the stress from the foreign matter R to the organic EL element 8 side when the organic EL display device 50*h* is bent. In addition, the existence of the foreign-matter contact portion 22*hr* in the sealing film 22*h* allows the second sealing layer 22*h*2 and thus the sealing film 22*h* to be formed without causing faults. Hence, even in the case where a foreign matter R exists, the sealing performance for the organic EL element 8 can be prevented from being impaired, and thus the organic EL element 8 can be more reliable.

(4) The sealing film 22*h* includes: the first sealing layer 22*h*1 that is formed before the foreign-matter contact layer 22*hr*0; and the second sealing layer 22*h*2 that is formed after the foreign-matter contact layer 22*hr*0. Hence, the sealing performance of the sealing film 22*h* can be enhanced easily. In addition, the first sealing layer 22*h*1 is formed before the foreign-matter contact layer 22*hr*0 is formed, and an ashing process is performed after the formation of the foreign-matter contact layer 22*hr*0. Hence, the damages that would otherwise be given to the organic EL element 8 by the ashing process can be reduced significantly.

Seventh Embodiment

Figures 32, 33A, 33B:
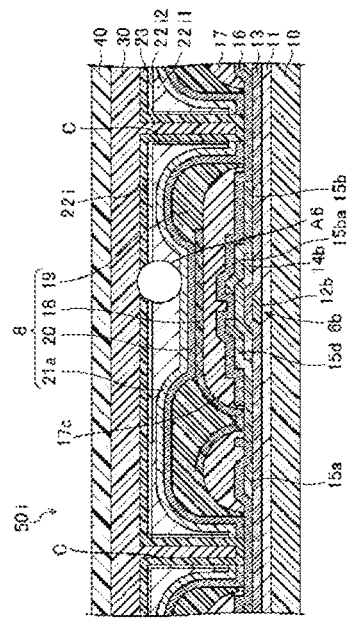
FIG. 32 is a cross-sectional view illustrating an organic EL display device according to a seventh embodiment of the disclosure, and is a diagram corresponding to FIG. 4.
FIG. 33A is an enlarged view of a portion A6 illustrated in FIG. 32 of a case where a foreign matter exists in the portion A6.
FIG. 33B is a plan view illustrating the foreign matter and the foreign-matter contact portion illustrated in FIG. 33A.

FIG. 32 to FIG. 33B illustrate the seventh embodiment of an organic EL display device according to the disclosure. FIG. 32 is a cross-sectional view illustrating an organic EL display device 50*i* according to the seventh embodiment of the disclosure, and is a diagram corresponding to FIG. 4. FIG. 33A is an enlarged view of a portion A6 illustrated in FIG. 32 of a case where a foreign matter exists in the portion A6. FIG. 33B is a plan view illustrating the foreign matter and the foreign-matter contact portion illustrated in FIG. 33A.

The description of the sixth embodiment is based on the organic EL display device 50*h* where the end faces of the organic EL layer 20 are covered by the sealing film 22*h* whereas the description of the present embodiment is based on the organic EL display device 50*i* where the end faces of the organic EL layer 20 are covered by the inorganic barrier film 23.

As illustrated in FIG. 32, the organic EL display device 50*i* includes: a base substrate 10; a plurality of organic EL elements 8; a plurality of sealing films 22*i*; an inorganic barrier film 23; an adhesive layer 30; and a function layer 40. Each of the organic EL elements 8 is formed over the base substrate 10, and in between are structures from a moisture-proof film 11 to interlayer insulating films 17. Each of the plurality of sealing films 22*i* is formed on the corresponding one of the organic EL elements 8. The inorganic barrier film 23 covers the individual sealing films 22*i*. The function layer 40 is formed over inorganic barrier film 23 with the adhesive layer 30 provided in between.

In addition, for example, as illustrated in FIG. 33A and FIG. 33B, in a case where a foreign matter R exists on the second electrode 21*a* (on the organic EL element 8), each of the sealing films 22*i* includes: a first sealing layer 22*i*1 that is layered on both the second electrode 21*a* and the foreign matter R; a foreign-matter contact portion 22*ir* that is configured to contact the foreign matter R; and a second sealing layer 22*i*2 that is layered on both the first sealing layer 22*i*1 and the foreign-matter contact layer 22*ir*. To put it differently, suppose a case where while an organic EL display device 50*i* is being manufactured, at least one foreign matter R exists in at least any one position on the organic EL element 8 in the organic EL display device 50*i* as illustrated in the enclosure A6 in FIG. 31. In this case, one foreign-matter contact portion 22*ir* is formed in the sealing film 22*i* for each place where a foreign matter R exists.

In addition, as illustrated in FIG. 33A, the foreign-matter contact portion 22*ir* is configured to surround the foreign matter R and to contact at least a surface portion Rt of the foreign matter R located on the organic EL element 8 side of the foreign matter R. In addition, in the sealing film 22*i*, the foreign-matter contact portion 22*ir*, the first sealing layer 22*i*1, and second sealing layer 22*i*2 wrap up the foreign matter R. Note that each of the first sealing layer 22*i*1 and the second sealing layer 22*i*2 is formed, for example, of a single layer film or a layered film of inorganic materials such as a silicon oxide film, a silicon nitride film, and a silicon oxynitride film. Note that the present embodiment is based on a case where each of the first sealing layer 22*i*1 and the second sealing layer 22*i*2 is formed of an inorganic film, but that each of the first sealing layer 22*i*1 and the second sealing layer 22*i*2 may be a layered film including not only one or more of the above-mentioned inorganic films and an organic film that is layered on the inorganic film. The organic film may be formed from acrylate, polyurea, parylene, polyimide, polyamide, or the like. In addition, the foreign-matter contact portion 22*ir* includes one of the above-mentioned organic films.

The organic EL display device 50*i* of the present embodiment described above can have the above-described effects (1), (2), (3), and (4).

Now, a detail description will be given below about the item (1). In the sealing film 22*i*, the grooves C are formed between every two adjacent ones of the plurality of subpixels P. Hence, the organic EL display device 50*i* has a smaller rigidity at portions between two adjacent ones of the plurality of subpixels P where the grooves C are formed. Hence, in a case where the organic EL display device 50*i* is bent around a bent axis that is parallel to the gate lines 12*a*, in the organic EL display device 50*i*, a larger bending strain is generated in the outer portions of the subpixel P where the grooves C are formed whereas a smaller bending strain is generated in the inner portions of the subpixel P where no grooves C are formed. Hence, as the sealing film 22*i* has a smaller strain, the generation of cracks in the sealing film 22*i* can be suppressed. Accordingly, when the organic EL display device 50*i* is bent, the generation of cracks in the sealing film 22*i* is suppressed. In addition, as the generation of cracks in the sealing film 22*i* can be suppressed, the sealing film 22*i* has an improved sealing performance, and thus the organic EL display device 50*i* becomes more reliable.

(2) In addition, the foreign-matter contact portion 22*ir* that contacts the foreign matter R existing on the organic EL element 8 is formed in the sealing film 22*i*. Hence, even in the case where a foreign matter R exists on the organic EL element 8, the generation of cracks in the sealing film 22*i* can be suppressed, and thus the organic EL display device 50*i* becomes more reliable. In addition, the foreign-matter contact portion 22*ir* is formed to contact at least the surface portion Rt of the foreign matter R located on the organic EL element 8 side of the foreign matter R. Hence, the foreign-matter contact portion 22ir can suppress the stress from the foreign matter R to the organic EL element 8 side when the organic EL display device 50i is bent. In addition, the existence of the foreign-matter contact portion 22ir in the sealing film 22i allows the first sealing layer 22i1 and thus the sealing film 22i to be formed without causing faults. Hence, even in the case where a foreign matter R exists, the sealing performance for the organic EL element 8 can be prevented from being impaired, and thus the organic EL element 8 can be more reliable.

(3) Even in a case where the perimeter edge surface of each organic EL layer 20 and at least a part of the perimeter edge surface of the sealing film 22i overlap each other, the inorganic barrier film 23 covering each of the sealing films 22i can prevent the organic EL element 8 from being degraded. In addition, the inorganic barrier film 23 is thinner than and has a better coatability than the sealing film 22i. Hence, the sealing ability can be prevented from being impaired while the flexibility of the organic EL display device 50i can be improved. In addition, even in a case where the remaining portion is formed in an end portion of the organic EL element 8, the remaining portion is covered by the inorganic barrier film 23. Hence, the sealing film 22i of the present embodiment can prevent cracks from being caused by the remaining portion. This effect is not obtainable from the sixth embodiment.

(4) The sealing film 22i includes: the first sealing layer 22i1 that is formed before the foreign-matter contact layer to form the foreign-matter contact portion 22ir; and the second sealing layer 22i2 that is formed after the foreign-matter contact layer. Hence, the sealing performance of the sealing film 22i can be enhanced easily. In addition, the first sealing layer 22i1 is formed before the foreign-matter contact layer is formed, and an ashing process is performed after the formation of the foreign-matter contact layer 22. Hence, the damages that would otherwise be given to the organic EL element 8 by the ashing process can be reduced significantly.

Other Embodiments

The descriptions of the embodiments provided so far are based on cases of organic EL display devices each of which includes a sealing film with grooves formed though the sealing film in the thickness direction. The disclosure may be applied to an organic EL display device including a sealing film with grooves formed in the sealing film but not therethrough in the thickness direction.

In addition, the description in each of the embodiments is based on a case of an organic EL display device where the sealing films are patterned by removing some portions of the inorganic film that is to be the sealing films and the portions to be removed are located between the subpixels. In addition, the flexibility of the organic EL display device may be enhanced by patterning not only the sealing films but also the moisture-proof films and the gate insulating films. To this end some portions of the inorganic film that is to be the moisture-proof films and some portions of the inorganic film that is to be the gate insulating films may be removed, and the portions to be removed are located between the subpixels.

In the embodiments described above, the example of the organic EL layer including the five-layer structure including the hole injecting layer, the hole transport layer, the light-emitting layer, the electron transport layer, and the electron injecting layer is given. It is also possible that, for example, the organic EL layer may include a three-layer structure including a hole injection-cum-transport layer, a light-emitting layer, and an electron transport-cum-injection layer.

In the embodiments described above, the example of the organic EL display devices include the first electrode as an anode and the second electrode as a cathode. However, the disclosure is also applicable to an organic EL display device, in which the layers of the structure of the organic EL layer are in the reverse order, with the first electrode being a cathode and the second electrode being an anode.

In the embodiments described above, the example of the organic EL display devices include the element substrate in which, the electrode of the TFT connected to the first electrode is the drain electrode. However, the disclosure is also applicable to an organic EL display device including an element substrate, in which the electrode of the TFT connected to the first electrode is referred to as the source electrode.

In addition, the description provided so far is based on a case where the disclosure is applied to an organic EL display device as an exemplar flexible display device. The disclosure is not limited to such a display device, and is applicable to any display device including a display element that is flexible and bendable. There are display elements of different types: display elements configured to control the brightness and/or transmittance by use of the electric current; and display elements configured to control the brightness and/or transmittance by use of the voltage. Some exemplar current-control display elements include: EL display devices such as organic EL (Electro Luminescence) display devices including Organic Light Emitting Diodes (OLEDs) and inorganic EL display devices including inorganic light emitting diodes; and Quantum dot Light Emitting Diode (QLED) display devices including (Quantum dot Light Emitting Diodes (QLEDs)). In addition, some exemplar voltage-control display elements include liquid crystal display elements.

INDUSTRIAL APPLICABILITY

As has been described so far, the disclosure is useful for a display device, such as a flexible organic EL display device.

REFERENCE SIGNS LIST

C Groove
P Subpixel
8 Organic EL element (display element)
10 Base substrate
12c, 15e, and 18a Common wiring line
20, 20g Organic EL layer (display layer)
21a, 21c to 21g Second electrode (cathode electrode)
22a to 22i Sealing film
22a1 to 22i1 First sealing layer
22h2 to 22i2 Second sealing layer
22ar to 22ir Foreign-matter contact layer
23 Inorganic barrier film
50a to 50i Organic EL display device (display device)
R Foreign matter

The invention claimed is:
1. A display device comprising:
a base substrate;
a display element formed on the base substrate and including a plurality of display layers arranged in a matrix shape; and
a sealing film formed on the display element, wherein a plurality of subpixels are defined in association with the plurality of display layer,
in the sealing film,
a plurality of grooves are formed through the interstices among the plurality of subpixels, and
a foreign-matter contact portion configured to be in contact with a foreign matter existing on the display element is formed,
the sealing film further includes a first sealing layer formed on the display element,
in the sealing film, the foreign-matter contact portion and the first sealing layer wrap up the foreign matter, and
in the foreign-matter contact portion, a taper angle with respect to the base substrate is smaller than 90°.

2. The display device according to claim 1, wherein the foreign-matter contact portion is positioned on a display-element side of the foreign matter and is configured to surround the foreign matter.

3. The display device according to claim 1, wherein in the display element, a taper angle of an end portion of the display element with respect to the base substrate is equal to or smaller than a predetermined angle.

4. The display device according to claim 1, wherein the foreign-matter contact portion is an organic film.

5. The display device according to claim 1, wherein the sealing film is separated into a plurality of portions by the grooves.

6. The display device according to claim 5, wherein the plurality of portions of the sealing film, which are separated, cover perimeter edge surfaces of the plurality of display layers.

7. The display device according to claim 5, further comprising an inorganic barrier film configured to cover the plurality of portions of the sealing film, which are separated, wherein the perimeter edge surfaces of the plurality of display layers overlap at least part of perimeter edge surfaces of the plurality of portions of the sealing film, which are separated.

8. The display device according to claim 7, wherein the perimeter edge surfaces of the plurality of display layers overlap the perimeter edge surfaces of the plurality of portions of the sealing film, which are separated.

9. The display device according to claim 7, wherein the inorganic barrier film is in contact with the perimeter edge surfaces of the plurality of display layers and the perimeter edge surfaces of the plurality of portions of the sealing film, which are separated.

10. A display device comprising:
a base substrate;
a display element formed on the base substrate and including a plurality of display layers arranged in a matrix shape; and
a sealing film formed on the display element,
wherein a plurality of subpixels are defined in association with the plurality of display layer,
in the sealing film,
a plurality of grooves are formed through the interstices among the plurality of subpixels, and
a foreign-matter contact portion configured to be in contact with a foreign matter existing on the display element is formed,
the sealing film further includes: a first sealing layer; and a second sealing layer formed on the first sealing layer and the foreign-matter contact portion,
in the sealing film, the foreign-matter contact portion, the first sealing layer, and the second sealing layer wrap up the foreign matter, and
in the foreign-matter contact portion, a taper angle with respect to the base substrate is larger than 90°.

11. The display device according to claim 10, wherein the foreign-matter contact portion is positioned on a display-element side of the foreign matter and is configured to surround the foreign matter.

12. The display device according to claim 10, wherein the sealing film is separated into a plurality of portions by the grooves.

13. The display device according to claim 12, wherein the plurality of portions of the sealing film, which are separated, cover perimeter edge surfaces of the plurality of display layers.

14. The display device according to claim 12, further comprising an inorganic barrier film configured to cover the plurality of portions of the sealing film, which are separated, wherein the perimeter edge surface of the plurality of display layers overlap at least part of perimeter edge surfaces of the plurality of portions of the sealing film, which are separated.

15. The display device according to claim 14, wherein the perimeter edge surfaces of the plurality of display layers overlap the perimeter edge surfaces of the plurality of portions of the sealing film, which are separated.

16. The display device according to claim 15, wherein the inorganic barrier film is in contact with the perimeter edge surfaces of the plurality of display layers and the perimeter edge surfaces of the plurality of portions of the sealing film, which are separated.

17. A display device comprising:
a base substrate;
a display element formed on the base substrate and including a plurality of display layers arranged in a matrix shape; and
a sealing film formed on the display element,
wherein a plurality of subpixels are defined in association with the plurality of display layer,
in the sealing film,
a plurality of grooves are formed through the interstices among the plurality of subpixels, and
a foreign-matter contact portion configured to be in contact with a foreign matter existing on the display element is formed
the sealing film is separated into a plurality of portions by the grooves, and
the plurality of portions of the sealing film, which are separated, are configured to cover perimeter edge surfaces of the plurality of display layer.

18. The display device according to claim 17, wherein the foreign-matter contact portion is positioned on a display-element side of the foreign matter and is configured to surround the foreign matter.

19. The display device according to claim 17, wherein the sealing film further includes a first sealing layer formed on the display element, and
in the sealing film, the foreign-matter contact portion and the first sealing layer wrap up the foreign matter.

20. The display device according to claim 17, wherein in the display element, a taper angle of an end portion of the display element with respect to the base substrate is equal to or smaller than a predetermined angle.

* * * * *